(12) United States Patent
Ikeda

(10) Patent No.: US 8,108,751 B2
(45) Date of Patent: Jan. 31, 2012

(54) TURBO DECODING APPARATUS

(75) Inventor: Norihiro Ikeda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 1115 days.

(21) Appl. No.: 11/907,477

(22) Filed: Oct. 12, 2007

(65) Prior Publication Data

US 2008/0092011 A1 Apr. 17, 2008

(30) Foreign Application Priority Data

Oct. 13, 2006 (JP) .................. 2006-280655

(51) Int. Cl.
*H03M 13/00* (2006.01)
(52) U.S. Cl. .............. 714/755; 714/794; 714/786
(58) Field of Classification Search .................. 714/755, 714/794, 796, 795, 786
See application file for complete search history.

(56) References Cited

U.S. PATENT DOCUMENTS

| 6,563,890 | B2 | 5/2003 | Obuchi et al. | |
|---|---|---|---|---|
| 7,530,011 | B2 * | 5/2009 | Obuchii et al. | 714/794 |
| 2004/0025103 | A1 | 2/2004 | Obuchii et al. | |
| 2005/0102600 | A1 | 5/2005 | Anandakumar | |
| 2005/0149836 | A1 * | 7/2005 | Tanaka | 714/794 |

FOREIGN PATENT DOCUMENTS

| JP | 2004-15285 | 1/2004 |
|---|---|---|
| JP | 20061919392 | 7/2006 |
| WO | WO 2000-052833 | 9/2000 |

OTHER PUBLICATIONS

Zhongfeng Wang, et al. "Area-efficient high-speed decoding schemes for turbo decoders" IEEE Transactions on Very Large Scale Integration (VLSI) Systems, IEEE Service Center, Piscataway, NJ, US; vol. 10, No. 6, Dec. 2002, pp. 902-912, XP002335788; ISSN: 1063-8210; *p. 909*.

Yuping Zhang, et al. "Parallel turbo decoding"; Proc. of Intern. Symposium on Circuits and Systems 2004, May 23, 2004, pp. 509-512, XP010720217 Vancouver, Canada ISBN: 0-7803-8251-X; *pp. II-510*.

Ohbuchi K, et al.; "Turbo decoder for high-speed application in Wideband Code Division Multiple Access system"; Proc. Globecom 2003, vol. vol. 7 of 7; Dec. 1, 2003; pp. 2355-2359, XP010677776; San Francisco, USA ISBN: 0-7803-7974-8; *p. 2355-p. 2357*.

(Continued)

*Primary Examiner* — Fritz Alphonse
(74) *Attorney, Agent, or Firm* — Murphy & King P.C.

(57) ABSTRACT

A turbo decoding apparatus comprises: a backward-probability calculation unit that executes backward-probability calculation from time N to time 0 with respect to coded data having an information length N (N is a natural number) which is encoded with turbo-encoding; a storage unit to store backward-probability calculation results extracted from a plurality of continuous backward-probability calculation results regarding a predetermined section of at intervals of n-time; a forward-probability calculation unit that executes forward-probability calculation from time 0 to time N with respect to the coded data; and a decoded result calculation unit that calculates a decoded result of the coded data through joint-probability calculation using forward-probability calculation results by the forward-probability calculation unit and the backward-probability calculation results stored in the storage unit and backward-probability calculation results obtained through recalculation by the backward-probability calculation unit.

8 Claims, 13 Drawing Sheets

OTHER PUBLICATIONS

El-Assal M, et al.: "A high speed architecture for map decoder" Proc. IEEE Workshop on Signal Processing Systems 2002. (SIPS'02), Piscataway, NJ, USA, Oct. 16, 2002, pp. 69-74, XP010616579; ISBN: 0-7803-7587-4/02; *p. 72*.

Wu Y, et al: "Forward Computation of Backward Path Metrics for Map Decoder" Proc. 2000 IEEE $51^{st}$. Vehicular Technology Conference, vol. vol. 3 of 3. Conf. 51; May 15, 2000, pp. 2257-2261, XP000968406; Tokyo, Japan ISBN: 0-7803-5719-1; *p. 2259-p. 2260*.

Schurgers C, et al: "Energy Efficient Data Transfer and Storage Organization for a map Turbo Decoder Mobule" Proceedings of the International Symposium on Low Power Electronics and Design, XX, XX, 1999, pp. 76-81, XP000953847; *p. 79*.

Notice of Reason for Rejection dated Oct. 26, 2010 in the corresponding Japanese application No. 2006-280655.

* cited by examiner

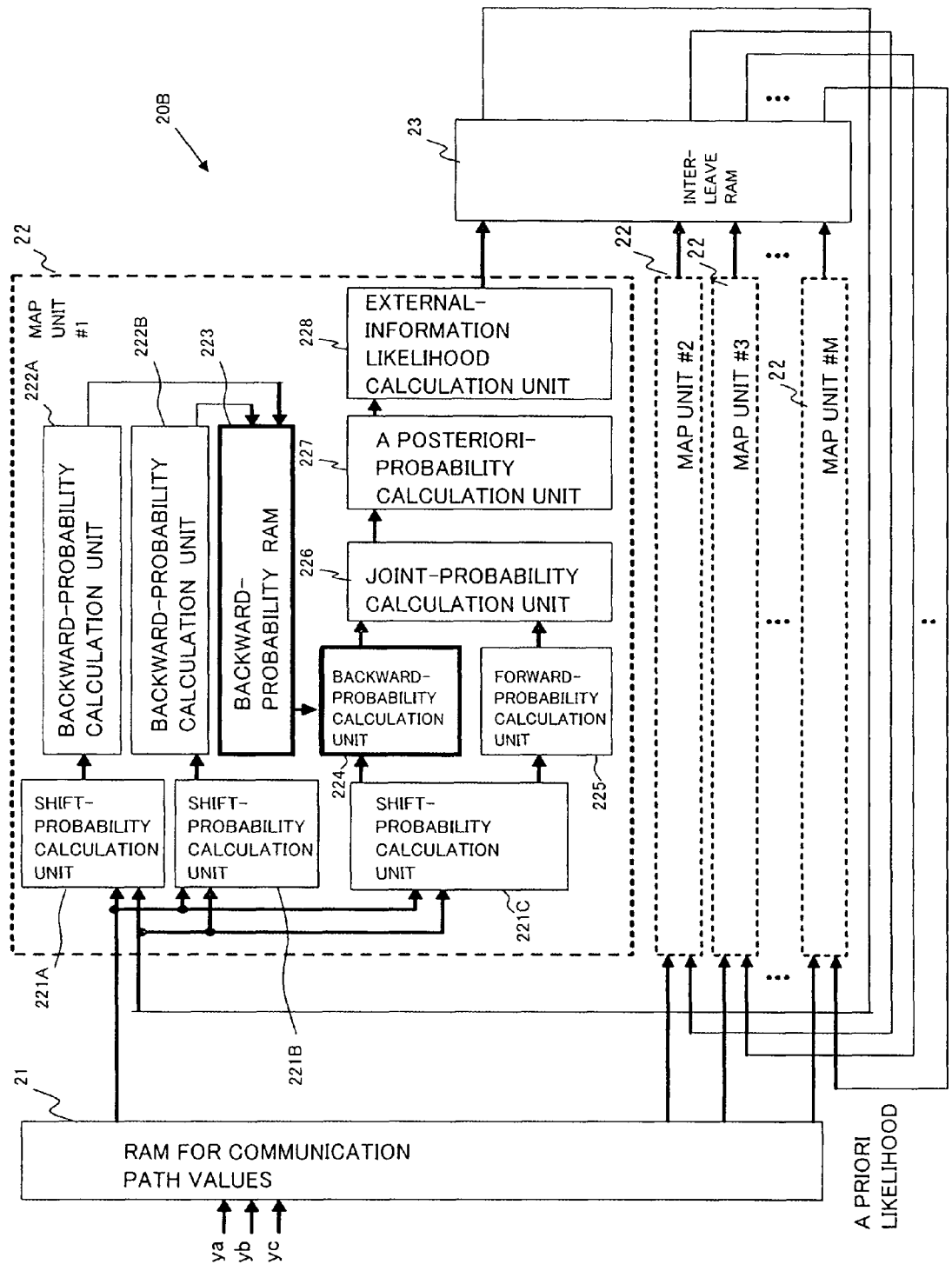

TURBO DECODING APPARATUS

BACKGROUND OF THE INVENTION

The present invention relates to a turbo decoding apparatus decoding data encoded by turbo-encoding.

Error correction codes are applied to systems which required to transmit data without any error in the case of transmitting the data or to read data to be stored in storages having a large capacity such as magnetic disks, CD-ROMs, etc. The error codes are applied to systems such as a mobile communication system, a facsimile (FAX), and a cash dispenser at the bank.

The turbo code is known as one of the error correction codes having a high coding gain. The turbo code is employed for the third generation mobile phone system (3GPP: the 3rd Generation Partnership Project) and is expected to be used for the next generation mobile phone system in the field of mobile communications.

FIG. 1 shows a diagram of an example of a configuration of a communication system including a turbo encoder and a turbo decoder. Information u having a length N is coded into pieces of coded data xa, xb and xc by the turbo encoder. The data xa is the information u itself, the data xb is coded data into which the information u is convolution-coded, and the data xc is coded data into which the information u is convolution-coded after interleaving. The pieces of coded data xa, xb, xc are affected by noises and fading when transmitting on a communication path and received as received signals ya, yb, yc. In a receiver, the turbo decoder executes a decoding process with respect to the reception signals (reception data), whereby a decoded result u' is acquired from the reception signals.

The symbols shown in FIG. 1 are expressed as follows.
Information (original data) u=[u1, u2, . . . , uN]
Coded data xa=[xa1, xa2, . . . , xak, . . . , xaN]
Coded data xb=[xb1, xb2, . . . , xbk, . . . , xbN]
Coded data xc=[xc1, xc2, . . . , xck, . . . , xcN]
Reception data ya=[ya1, ya2, . . . , yak, . . . , yaN]
Reception data yb=[yb1, yb2, . . . , ybk, . . . , ybN]
Reception data yc=[yc1, yc2, . . . , yck, . . . , ycN]
Decoded result (decoded data) u'=[u'1, u'2, . . . , u'N]

FIG. 2 illustrates an example of a configuration of the turbo decoding apparatus (turbo decoder). The turbo decoding apparatus, to start with, uses a first component decoder DEC 1 in order to decode the reception signals ya, yb among the reception signals ya, yb and yc. Next, a second component decoder DEC 2 executes the decoding process by using a likelihood of a decoded result of the DEC 1 and using the reception signal yc. On this occasion, the likelihood of the decoded result of the DEC 1 is subjected to an interleaving process by an interleaver and input to the DEC 2. A likelihood of the decoded result of the DEC 2 is subjected to a deinterleaving process by a deinterleaver and input again to the DEC 1. The decoded result u' is decoded data obtained by 0-or-1 determination with respect to the deinterleaved result of the DEC 2. A characteristic of an error rate is improved by repeating the decoding process. Therefore, the turbo decoding apparatus executes the decoding process in a way that repeats the decoding operation a predetermined number of times.

Note that FIG. 2 illustrates, in terms of explaining the principle, two pieces of component decoders (DEC 1 and DEC 2), the interleaver, and the deinterleaver as the components of the turbo decoding apparatus, however, a general scheme in terms of a hardware configuration is that one element decoder that functions as both of the interleaver and the deinterleaver is employed.

A Conventional Example 1 will be described in a turbo decoding apparatus applied to Maximum A Posteriori Probability Decoding (MAP), which is employed as a component decoder of a turbo decoding apparatus in general.

FIG. 3 shows a block diagram of a turbo decoding apparatus to which a MAP decoder is applied. A decoding procedure (sequence) using the MAP is given as below. A Random Access Memory (RAM) for communication path values) can save the reception signals ya, yb, yc and can output the reception signals in the way of properly exchanging an output order.

In FIG. 3, for example, when a coding rate R is given by R=1/2 and N is an information length, the original information u, the coded data xa, xb, and the reception signals ya, yb are as the followings.
Original Information:
u=[u1, u2, u3, . . . , uN]
Coded Data:
xa=[xa1, xa2, xa3, . . . xak, . . . , xaN]
xb=[xb1, xb2, xb3, . . . xbk . . . ,
Reception Data:
ya=[ya1, ya2, ya3, . . . , yak, . . . , yaN]
yb=[yb1, yb2, yb3, . . . ybk . . . , .

Note that the information length N includes a tail bit added on the side of the turbo encoder.

In FIG. 3, a shift-probability calculation unit, when receiving the reception data (yak,ybk) at time k, calculates each of the following probabilities as a shift probability $\gamma s, k$ (where s=0 to 3):
probability $\gamma 0, k$ when (xak,xbk) is (0,0);
probability $\gamma 1, k$ when (xak,xbk) is (0,1);
probability $\gamma 2, k$ when (xak,xbk) is (1,0); and
probability $\gamma 3, k$ when (xak,xbk) is (1,1).

A backward-probability calculation unit calculates a backward-probability $\beta k-1(m)$ in each status m (m=0 to 7) at time k-1 by use of a backward-probability $\beta k(m)$ and the shift-probability $\gamma s, k$ (s=0 to 3) at the time k, and stores the backward-probability in a backward-probability RAM (memory). Hereinafter, the shift-probability calculation unit and the backward-probability calculation unit repeat the calculations at the time k given by k=k-1, then calculate the probabilities with respect to the time k=N through k=0, and stores the backward-probability $\beta k(m)$ corresponding to each of the times k=0 through N in the backward-probability RAM.

Thereafter, the shift-probability calculation unit and a forward-probability calculation unit calculate a forward-probability a1,k with the original data uk being "1" and a forward-probability a0,k(m) with the original data uk(m) being "0" in each status m at the time k by use of a forward-probability a1,k−1(m) with the original data uk−1 being "1", a forward-probability a0,k−1(m) with the original data uk−1 being "0", and a shift-probability $\gamma s,k$ at the time (k−1).

A joint-probability calculation unit calculates a probability $\gamma 1,k(m)$ with the k-th original data uk being "1" in a way that multiplies a forward-probability a1,k(m) in each status m at the time k by the backward-probability $\beta k(m)$ stored in the backward-probability RAM. Similarly, the joint-probability calculation unit calculates a probability $\gamma 0,k(m)$ with the original data uk being "0" by use of the forward-probability a0,k(m) in each status m at the time k and the backward-probability $\beta k(m)$.

The a posteriori probability calculation unit obtains both of a total sum $Sm\gamma 1,k(m)$ of the probabilities that are "1" by adding the probabilities $\gamma 1,k(m)$ that are "1" in each status m at the time k and a total sum $Sm\gamma 0,k(m)$ of the probabilities that are "0" by adding the probabilities $\gamma 0,k(m)$ that are "0" in each status m at the time k, and outputs a logarithmic likelihood (a posteriori probability L(u1k)) given by the following formula (1):

$$L(u1k)=\log[Sm\gamma1,k(m)/Sm\gamma0,k(m)] \quad (1)$$

An external information likelihood calculation unit, with the a posteriori probability L(u1k) containing an a priori likelihood and a communication path value at time of inputting, removes these values and thus calculates an external information likelihood Le(u1k). The external information likelihood Le(u1k) is stored in an interleave RAM, then is interleaved, subsequently is output as an a priori likelihood L(u1k') in a next decoding process, and is fed back to the shift-probability calculation unit.

The first half of the decoding process (single MAP decoding process) of the turbo decoding is finished in the way described above, next what the reception data ya interleaved and the a priori likelihood L(u1k') acquired in the first half of the decoding process are deemed as reception data ya', and the MAP decoding process is executed by using ya' and yc, thereby outputting a likelihood L(u2k). Thus, one turbo decoding process is terminated. Hereinafter, the turbo decoding process is repeated a predetermined number of times (e.g., 8 times), in which a decoded result uk=1 is output when the acquired posteriori probability L(u8k)>0, and a decoded result uk=0 is output when L(u8k)<0.

In this type of MAP decoding method, the first half of the decoding process involves the process of calculating the shift-probability and the backward-probability, and storing the backward-probability β in the backward-probability RAM, and the second half of the process involves calculating the shift-probability, the forward-probability, the joint-probability, the a posteriori-probability, and the external information likelihood. Namely, in this decoding method, the backward-probability RAM (memory) is stored with the backward-probability βk(m) without storing the forward-probabilities a1,k(m), a0,k(m).

In other words, the processes are as the followings.

(1) Calculation of shift-probability

The shift-probabilities γs,k is obtained from the reception data (yak, ybk) received at the time k, with respect to all of combinations of the case where each piece of coded data (xa, xb) becomes "0" and the case where the coded data (xa, xb) becomes "1". The calculation of the shift-probability is performed respectively at the time of (2) the calculation of the backward-probability and (3) the calculation of the forward-probability that follow.

(2) Calculation of Backward-Probability

Calculations of the backward-probabilities at the time N through the time 0 are sequentially conducted. The backward-probability βk (i.e., β0,k, β1,k) at the time k is calculated from an backward-probability βk+1 at the time k+1 and a shift-probability at the time k+1, and results thereof are stored in the memory (backward-probability RAM) stored with the calculated results of the backward-probability.

(3) Calculation of Forward-Probability

Calculations of the forward-probabilities at the time 0 through the time N are sequentially performed. The forward-probability a0,k when the data is "0" at the time k and the forward-probability a1,k when the data is "1" at the time k are calculated from the forward-probability a0,k−1 when the data is "0" at the time k−i, the forward-probability a1,k−1 when the data is "1", and the shift-probability γs,k at the time k.

(4) Calculation of Joint (Binding) Probability

A calculation of the joint-probability is executed simultaneously with (3) the calculation of the forward-probability. Probabilities when each status is "0" at the time k is calculated from a0,k and β0,k, and probabilities when each status is "1" is calculated from a1,k and β1,k.

(5) Calculation of Posteriori Probability

The a posteriori probability uk and the likelihood of uk are calculated by adding the probabilities when each status is "1" at the time k and adding the probabilities when each status is "0".

(6) Calculation of External Information Likelihood

The a posteriori probability calculation result uk at the time k contains the a priori likelihood and the communication path value when inputting, and hence these values are removed.

Decoding time (MAP decoding time) in the case of performing the calculations (1) to (6) once as the MAP decoding process is 2N. One turbo decoding process is completed with two MAP decoding processes. Hence, the processing time for one turbo decoding process becomes 4N, and, if a repetition count of the turbo decoding process is "8", the turbo decoding process time becomes 32N.

FIG. 4 shows a timing chart of the single MAP decoding process. In this case, a memory capacity for storing the backward-probability calculation results βk is required to all of nodes N.

Next, a Conventional Example 2 will be described. The system of the Conventional Example 1 has the large memory capacity for storing the backward-probability calculation results and is therefore not suited to implementation of the circuit if as it is. Therefore, a method of reducing the memory capacity for storing the backward-probability calculation results is proposed (e.g., Patent Document 1). FIG. 5 shows a timing chart per MAP decoding process based on a system in the Conventional Example 2.

The decoding procedure of the method according to the Conventional Example 2 described in the Patent Document 1 has the following differences in the comparison with the Conventional Example 1.

(1) The information length N is segmented by a predetermined length L into a plurality of blocks, and the decoding is conducted in every segment L defined as a basic unit. In this case, the information length N (time segments (section) 0 to N) is segmented into segments 0 to L1, L1 to L2, L2 to L3, . . . , Lx to N.

(2) The backward-probabilities are calculated toward time from time N+Δ. At this time, in the backward-probability calculation results in the respective periods of time N through 0, the memory is stored with the backward-probability calculation results (discrete β) in periods of time Lx, . . . , L3, L2 for every segment L and also stored with the backward-probability calculation results (continuous β) in all periods of time L1 to 0.

(3) Thereafter, the forward-probabilities in the periods of time 0 through L1 are calculated. At this time, the backward-probability calculation results (continuous β) in the periods of time 0 through L1, which are stored in the memory, are read, and the joint-probability, the a posteriori probability, and the external information likelihood with respect to each of the periods of time 0 to L1 are calculated. Almost simultaneously with the start of calculating the forward-probabilities in the periods of time 0 to L1, the backward-probability calculation results (discrete B) in L2 are read from the memory, then the backward-probabilities in the periods of time L2 to L1 are calculated by setting the backward-probability calculation results as an initial value, and the backward-probability calculation results are stored in the memory.

(4) Hereinafter, the decoding is performed in every segment L down to N by repeating the processes (1) to (3).

The process time in the Conventional Example 2 becomes 2N by the single MAP decoding process in the same way as in the Conventional Example 1. Hence, if the repetition count is 8, the turbo decoding process time becomes 32N.

In the Conventional Example 2, the memory capacity for storing the backward-probability calculation results is N/L+2L in a way that takes account of avoiding a read-write access confliction to the RAM (memory) for storing the backward-probability calculation results.

Next, a Conventional Example 3 will be illustrated (e.g., Patent Document 1). The Conventional Example 3 is, unlike the Conventional Example 1, a backward-probability calculation method capable of reducing the process time and the memory capacity. The system in the Conventional Example 3, as demerits, slightly declines in terms of the characteristic of the error rate and entails implementing two pieces of backward-probability calculation units.

A decoding procedure of the method according to the Conventional Example 3 has the following differences from the Conventional Example 1. FIG. 6 shows a timing chart of one MAP decoding process in the Conventional Example 3.

(1) The information length N is segmented by a predetermined length L into a plurality of blocks, and the decoding is conducted in every segment L defined as a basic unit. The information length N (time segments 0 to N) is segmented into segments 0 to L1, L1 to L2, L2 to L3, . . . , Lx to N.

(2) A first backward-probability calculation unit calculates the backward-probabilities in a period of the time L2 to 0. At this time, the calculation results in the period of the time L2 through the time L1 is not adopted because of its low reliability, and only the calculation results of the backward-probabilities in the time segment of L1 through 0 are stored in the RAM (memory).

(3) Next, the calculation of the forward-probabilities in the time 0 to L1 is executed, and the joint-probability, the a posteriori probability, and the external information likelihood are calculated by employing the calculation results of the forward-probabilities and the calculation results of the backward-probabilities stored in the memory.

(4) At a point of time when the first backward-probability calculation unit finishes calculating the backward-probabilities up to L1, a second backward-probability calculation unit starts calculating the backward-probabilities in the periods of time L3 through L1. The calculation of the backward-probabilities in the time segment L2 to L1 is executed in parallel with the calculation of the forward-probabilities in the time segment 0 to L1. In this case, the calculation results of the backward-probabilities in the time L3 through the time L2 are not adopted because of its low reliability, and only the calculation results of the backward-probabilities in the time segment of L2 through L1 are stored in the RAM (memory).

(5) Subsequent to calculating the forward-probabilities in the segment 0 to L1, the calculation of the forward-probabilities in the segment L1 to L2 are executed, and the joint-probability, the a posteriori probability, and the external information likelihood are calculated by employing the calculation results of the forward-probabilities and the calculation results of the backward-probabilities stored in the memory by the second backward-probability calculation unit.

(6) Hereinafter, the processes are repeated for every time segment L, and the decoding is conducted down to N.

The process time in the Conventional Example 3 becomes 2N by the single MAP decoding process in the same way as in the Conventional Example 1, and, if the repetition count is 8, the turbo decoding process time becomes 32N. In the Conventional Example 3, a capacity of the RAM (memory) for storing the calculation results of the backward-probabilities is required 2L when taking into consideration the write-read access conflict.

The Conventional Examples 2 and 3 are the methods for reducing a circuit scale by reducing the memory capacity as compared with the Conventional Example 1. On the other hand, a method described in Patent Document 1 is given as a method of reducing the time required for decoding (Conventional Example 4). The system in the Conventional Example 4 is that the information length N is segmented into M-pieces of blocks, and the MAP calculation operations are executed in parallel in the respective blocks, thereby reducing the process time.

The system in the Conventional Example 4 can be applied to each of the systems in the Conventional Examples 1 to 3, and the process time when applied to each system becomes 1/M. FIG. 7 shows a timing chart in the case of applying the system of the Conventional Example 4 to the Conventional Example 2.

The Conventional Example 4 prepares the MAP decoders illustrated in FIG. 3, corresponding to a number of blocks M (MAP#1 to #M). The M-pieces of blocks are expressed such as blocks N/M, 2N/M, . . . , N(M−1)/M, N.

A first MAP decoder (MAP#1) executes the decoding process in the Conventional Example 2 with respect to the block in a segment 0 to N/M, a second MAP decoder (MAP#2) executes the decoding process in the Conventional Example 2 with respect to the block in a segment N/M to 2N/M, and MAP decoders MAP#3, . . . , #M execute the same decoding process.

Herein, each MAP decoder, when calculating the backward-probability, performs the calculation of the backward-probability by a predetermined extra amount Δ, and writes, in the backward-probability calculation results obtained after calculating the extra portions, only the calculation results of the backward-probability with respect to the last segmented data to the memory. For example, the MAP#1 calculates the backward-probabilities of N/M+Δ to 0, and stores the calculation results of the backward-probabilities of L1 to 0 in the memory. The backward-probability is calculated by use of the calculation result of the backward-probability one or more times before, and hence the backward-probability β having a high reliability in the time N/M can be acquired by calculating the backward-probabilities from backward by the extra amount Δ.

When applying the Conventional Example 4, the memory capacity for storing the calculation results of the backward-probabilities is given as follows.

(1) Case of being Applied to the Conventional Example 1: N/M*M=N (2) Case of being applied to the Conventional Example 2: N/L+2LM (3) Case of being Applied to the Conventional Example 3: 2LM Such a case is assumed that the turbo codes are used in a mobile phone system where the fast transmission is carried out. For example, in the case of realizing a transmission speed of 100 Mbps, it requires the decoding process of 100 M bits per second.

Herein, for example, in the case of executing the turbo decoding process by employing a 100 MHz system clock while applying the system in the Conventional Example 2, 32 seconds are needed for the data decoding per second. Accordingly, 32 pieces of turbo decoders must be implemented, resulting in an enlarged circuit scale. By contrast, the fast decoding process is executed by applying the method as in the Conventional Example 4, thereby enabling the circuit scale to be reduced by decreasing the number of the turbo decoders to be implemented. Further, the Conventional Example 1 requires the large memory capacity and is not suited to implementation of the circuit, and the Conventional Examples 2 and 3 capable of reducing the memory capacity are considered to be applied preferentially in terms of reducing the circuit scale.

[Patent Document 1] JP 2004-15285 A
[Patent Document 2] JP 3451246 A

Such a configuration is considered that the memory capacity is reduced by employing the Conventional Example 2 with no occurrence of deterioration of the characteristic of the error rate, which is seen in the Conventional Example 1, and the process time is reduced by use of the Conventional Example 4. In this case, the memory capacity needed for storing the calculation results of the backward-probabilities is given by N/L+2LM. Herein, when an M's value is increased for speeding up the process, the memory capacity approximates to an N's value in the Conventional Example 1, and an effect in reducing the memory capacity owing to the application of the Conventional Example 2 fades away. This is derived from the necessity of providing the memories, decreased in the Conventional Example 2, respectively to the plurality of MAP calculation units implemented in the Conventional Example 4. This is also applied to a case of reducing the memory capacity by adopting not the Conventional Example 2 but the Conventional Example 3.

Thus, in a combination of the Conventional Examples 2 to 3 and the Conventional Example 4, when processed at a high speed, the effect in reducing the memory capacity owing to applying the Conventional Examples 2 and 3 fades away. Therefore, this greatly affects the circuit scale of the turbo decoding device. In particular, this is a factor that hinders downsizing mobile terminal device mounted with the turbo decoder.

SUMMARY OF THE INVENTION

It is an object of an embodiment of the present invention to provide a turbo decoder enabling a circuit scale to be reduced.

It is another object of an embodiment of the present invention to provide a turbo decoder enabling the circuit scale to be reduced while restraining an increase in process time.

An embodiment of a turbo decoding apparatus adopts the following means in order to achieve the objects.

That is, a first aspect of a turbo decoding apparatus, may comprise:

a backward-probability calculation unit that executes backward-probability calculation from time N to time 0 with respect to coded data having an information length N which is encoded with turbo-encoding;

a storage unit to store backward-probability calculation results extracted from a plurality of continuous backward-probability calculation results regarding a predetermined section of at intervals of n-time;

a forward-probability calculation unit that executes forward-probability calculation from time 0 to time N with respect to the coded data; and a decoded result calculation unit that calculates a decoded result of the coded data through joint-probability calculation using forward-probability calculation results by the forward-probability calculation unit and the backward-probability calculation results stored in the storage unit and backward-probability calculation results obtained through recalculation by the backward-probability calculation unit.

According to the first aspect of the turbo decoding apparatus, backward-probability calculation results are stored in the storage unit at intervals of n-piece (n is natural number). Therefore, a memory capacity is reduced. A circuit scale also is reduced.

The first aspect may be configured so that the joint-probability calculation is executed in parallel with the forward-probability calculation;

the decoded result calculation unit calculates, if a backward-probability calculation result at time i being one of the times 0 to N corresponding to a forward-probability calculation result at the time i calculated by the forward-probability calculation unit is stored in the storage unit, a joint-probability at the time i by using the backward-probability calculation result at the time i stored in the storage unit and the forward-probability calculation result at the time i;

the backward-probability calculation unit recalculates, if the backward-probability calculation result at the time i is not stored in the storage unit, the backward-probability at the time i based on a shift-probability calculation result at time (i+1) for calculating a forward-probability at the time (i+1) and a backward-probability calculation result at the time (i+1) stored in the storage unit; and the decoded result calculation unit calculates the joint-probability at the time i by using the recalculated backward-probability calculation result at the time i and the forward-probability calculation result at the time i.

According to the above-mentioned configuration, a shift-probability calculation result calculated for forward-probability calculation may be available for recalculation of a backward-probability calculation. Therefore, shift-probability calculation for the recalculation may be omitted, and increase of processing time may be controlled.

A second aspect is a turbo decoding apparatus for decoding turbo-encoded data through repetition of element decoding. The second aspect of the turbo decoding apparatus may comprise:

M-number of element decoders each performing element decoding to one of M-pieces of divided data obtained by dividing turbo-encoded data having an information length N-bit by M; and an interleaver/deinterleaver for alternately interleaving and deinterleaving M-pieces of results of element-decoding collectively, wherein each of the M-number of element decoders includes:

a backward-probability calculation unit that executes backward-probability calculation with respect to one of the M-pieces of divided data;

a storage unit to store backward-probability calculation results extracted from N/M-pieces of backward-probability calculation results with respect to the one of the M-pieces of divided data at intervals of n-piece;

a forward-probability calculation unit that executes a forward-probability calculation with respect to the one of the M-pieces of divided data; and a decoded result calculation unit that outputs element-decoded results of the M-pieces of divided data through joint-probability calculation by using N/M-pieces of forward-probability calculation results with respect to the one of the M-pieces of divided data and N/M-pieces of backward-probability calculation results obtained by reading from the storage unit or obtained through recalculation by the backward-probability calculation unit.

A third aspect is a turbo decoding apparatus for decoding turbo-encoded data through repetition of element decoding. The third aspect of the turbo decoding apparatus may comprise:

M-number of element decoders each performing element decoding to one of M-pieces of divided data obtained by dividing turbo-encoded data having an information length N-bit by M; and an interleaver/deinterleaver for alternately interleaving and deinterleaving M-pieces of results of element-decoding collectively, wherein each of the M-number of element decoders includes:

a backward-probability calculation unit that executes backward-probability calculation with respect to one of the M-pieces of divided data;

a storage unit to divide one of the M-pieces of divided data into X-pieces of sections by a predetermined length L, to store backward-probability calculation results in each of X-th through second sections within the X-pieces of sections for every predetermined length L discretely with intervals of the predetermined length L, and to store backward-probability calculation results extracted from L-pieces of backward-probability calculation results with respect to a first section within the X-pieces of sections at intervals of n-piece;

a forward-probability calculation unit that executes forward-probability calculation with respect to one of the M-pieces divided data; and a decoded result calculation unit that calculates, with respect to the respective sections of the M-pieces of divided data, element-decoded results in the respective sections through joint-probability calculation by using L-pieces of forward-probability calculation results and L-pieces of backward-probability calculation results corresponding thereto, wherein:

the decoded result calculation unit outputs the element-decoded result with respect to the first section through the joint-probability calculation by using L-pieces of forward-probability calculation results in the first section calculated by the forward-probability calculation unit and L-pieces of backward-probability calculation results in the first section obtained by reading from the storage unit or obtained through recalculation by the backward-probability calculation unit;

the backward-probability calculation unit executes the backward-probability calculation with respect to a next section by using the backward-probability calculation results regarding the next section stored in the storage unit, calculates L-pieces of backward-probability calculation results regarding the next section, and stores backward-probability calculation results extracted from the L-pieces of backward-probability calculation results regarding the next section at intervals of n-piece in the storage unit;

the forward-probability calculation unit executes forward-probability calculation with respect to the next section to obtain L-pieces of forward-probability calculation results regarding the next section; and the decoded result calculation unit outputs the element-decoded result with respect to the next section through joint-probability calculation by using the L-pieces of forward-probability calculation results regarding the next section and L-pieces of backward-probability calculation results regarding the next section obtained by reading from the storage unit or obtained through recalculation by the backward-probability calculation unit.

A fourth aspect is a turbo decoding apparatus for decoding turbo-encoded data through repetition of element decoding. The fourth aspect may comprise:

M-number of element decoders each performing element decoding to one of M-pieces of divided data obtained by dividing turbo-encoded data having an information length N-bit by M; and an interleaver/deinterleaver for alternately interleaving and deinterleaving M-pieces of results of element-decoding collectively, wherein each of the M-number of element decoders includes:

a backward-probability calculation unit that executes backward-probability calculation with respect to one of the M-pieces of divided data;

a storage unit to store backward-probability calculation results regarding one of the M-pieces of divided data;

a forward-probability calculation unit that executes forward-probability calculation with respect to one of the M-pieces of divided data; and a decoded result calculation unit that calculates the element-decoded results through calculation of a joint-probability using a forward-probability calculation result and the backward-probability calculation results, wherein:

the backward-probability calculation unit divides one of the M-pieces of divided data into a plurality of sections for every predetermined length L, executes backward-probability calculation regarding a 2L-th bit through a first bit, and stores backward-probability calculation results extracted from backward-probability calculation results of the 2L-th bit through the first bit at intervals of n-piece, in the storage unit;

the forward-probability calculation unit executes forward-probability calculation regarding the first bit through an L-th bit of the one of the M-pieces of divided data;

the decoded result calculation unit executes joint-probability calculation by using forward-probability calculation results regarding the first bit through the L-th bit and backward-probability calculation results regarding the first bit through the L-th bit obtained by reading from the storage unit or obtained through recalculation by the backward-probability calculation unit, and outputs element-decoded results regarding a section from the first bit to the L-th bit;

the backward-probability calculation unit executes backward-probability calculation from a 3L-th bit to a (L+1)th bit of the one of the M-pieces of divided data during backward-probability calculation from a 2L-th bit to the first bit, and stores backward-probability calculation results extracted from backward-probability calculation results from the 2L-th bit to the (L+1)th bit at intervals of n-piece, in the storage unit;

the forward-probability calculation unit executes forward-probability calculation from the (L+1)th bit to the 2L-th bit; and the decoded result calculation unit executes joint-probability calculation by using forward-probability calculation results from the (L+1)th bit to the 2L-th bit and backward-probability calculation results from the (L+1)th bit to the 2L-th bit obtained by reading from the storage unit or obtained through recalculation by the backward-probability calculation unit, and outputs the element-decoded results regarding a section from the (L+1)th bit to the 2L-th bit.

According to an embodiment of the turbo decoding apparatus enabling a circuit scale to be reduced is provided.

Also, according to the embodiment of the turbo decoding apparatus enabling the circuit scale to be reduced while restraining an increase in process time is provided.

BRIEF DESCRIPTION OF THE DRAWINGS

FIG. 13 is a diagram showing an example of the configuration of a turbo decoding apparatus of a Specific Example 3 of the embodiment of the present invention.

DETAILED DESCRIPTION OF THE EMBODIMENTS

Outline of Embodiment

Each of the Conventional Examples 1-3 is characterized by executing the forward-probability calculation after storing results of the backward-probability calculation in each time (time N to time 0) in the memory, and executing the joint-probability calculation by use of the forward-probability calculation results in each time and the backward-probability calculation results in each time stored in the memory. In the Conventional Examples 2 and 3, the memory is stored with the continuous calculation results of the backward-probabilities in the time segment (section) L1-0 (from time L to the time 1).

A scheme in an embodiment of a turbo decoding apparatus is not that all of the calculation results of the backward-probabilities of each time are stored but that the memory capacity is reduced by saving the calculation results of the backward-probabilities in a way that thins out the calculation results at intervals of n-time In this case, as to a portion of the backward-probability calculation results that are not stored in the memory, the backward-probability is recalculated by using the forward-probability calculation result stored in the memory at a point of time when executing the forward-probability calculation.

Normally, recalculation of the backward-probability is performed by use of a transmission path value and external likelihood information, which are stored in the memory. The transmission path value and the external likelihood information are input values for calculating a forward-probability. Accordingly, when recalculating the backward-probability and calculating the forward-probability in parallel, a memory access conflict occurs. In order to avoid the memory access conflict, if accessing the memory with a time shift, a rise in process time is brought about.

An input value for calculating the forward-probability and an input value for calculating the backward-probability of a portion that is saved on a thinning-out basis, however, involve using values in the vicinity of a bit string. Accordingly, the same input value can be used at the same point of time in calculating these probabilities by reviewing a calculation order. Hence, the recalculation can be executed simply by adding a backward-probability calculation unit for interpolating the thinning-out portion without increasing the process time.

Figure 8:
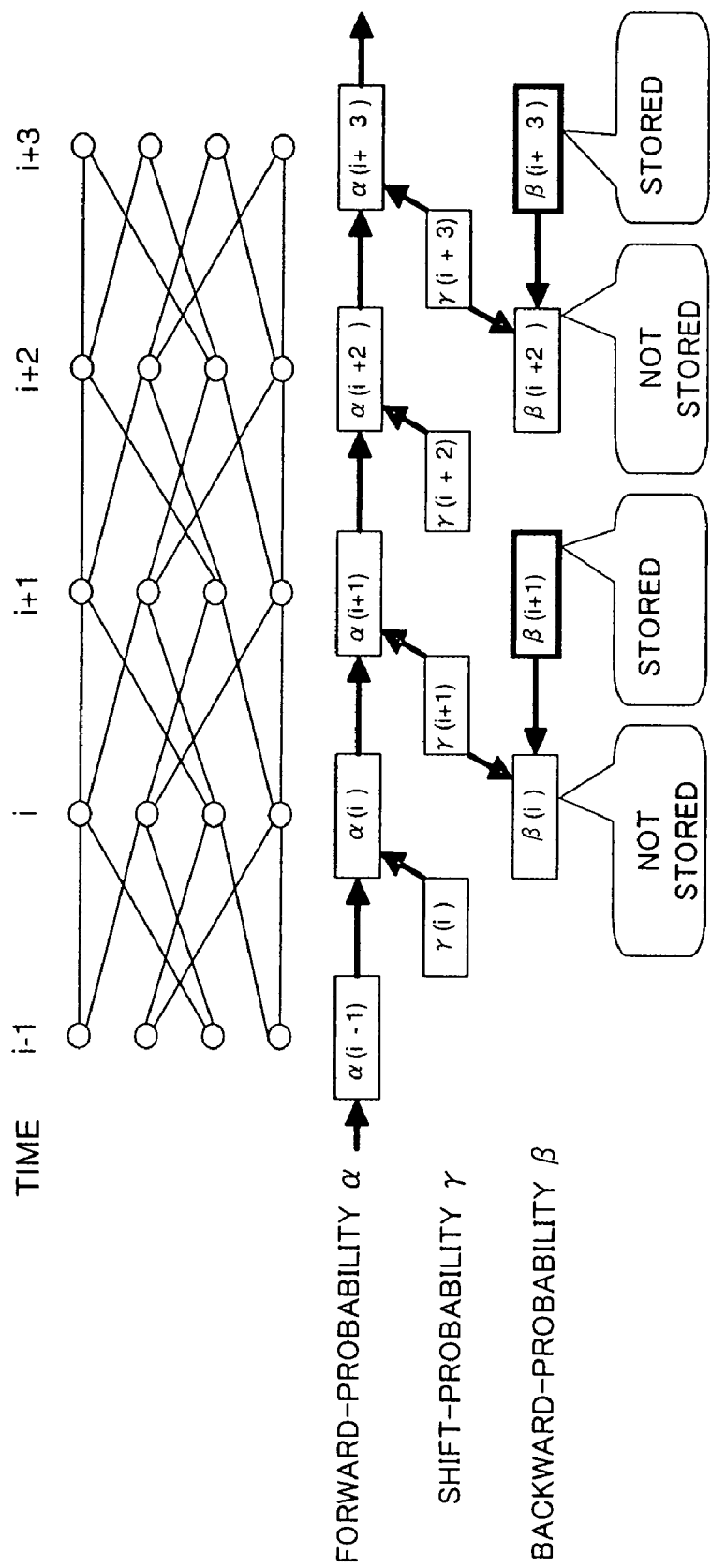
FIG. 8 is a conceptual diagram of a joint-probability calculating process according to an embodiment of the present invention.
Figure 9:
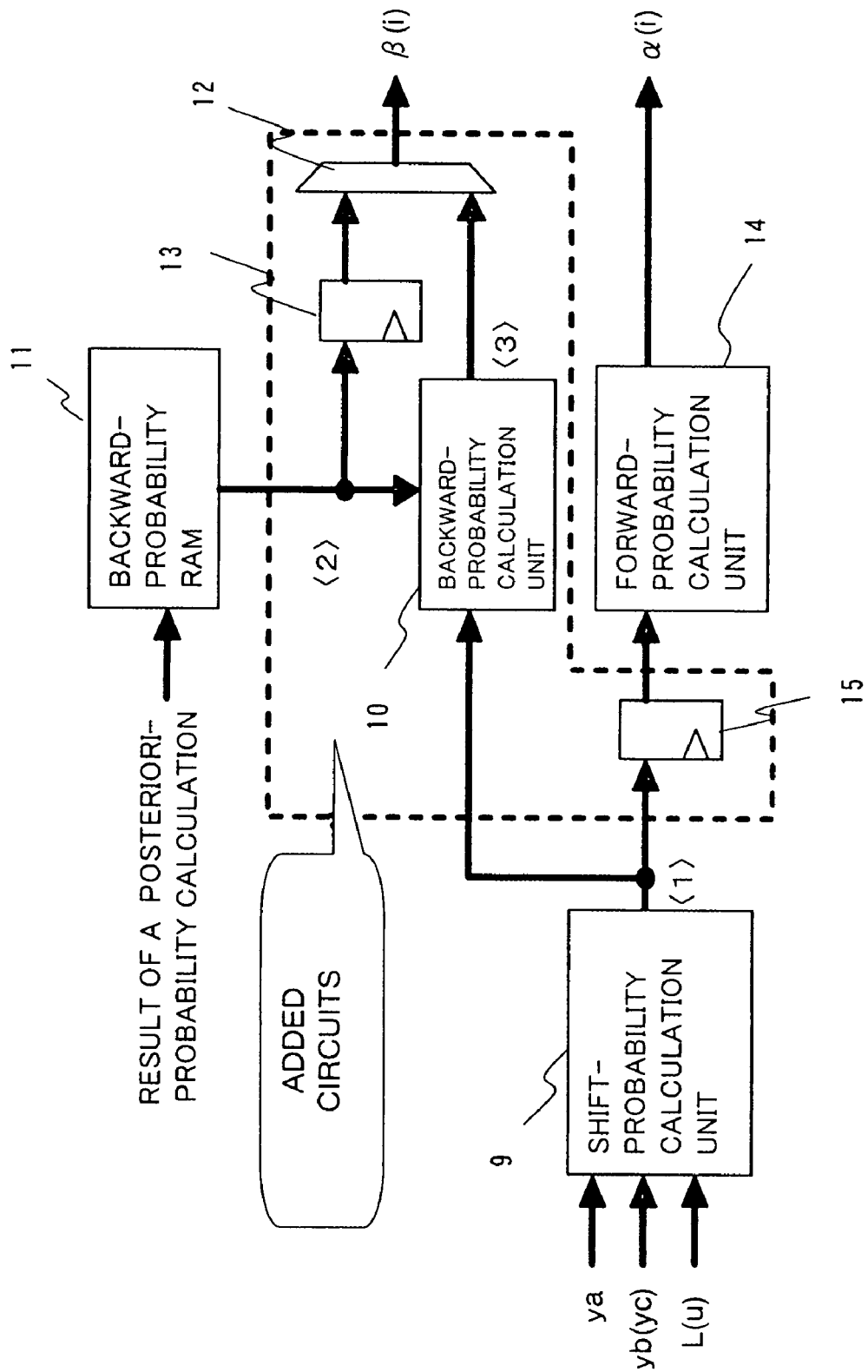
FIG. 9 is a diagram showing an example of blocks of circuit units to be added in the embodiment of the present invention.
Figure 10:
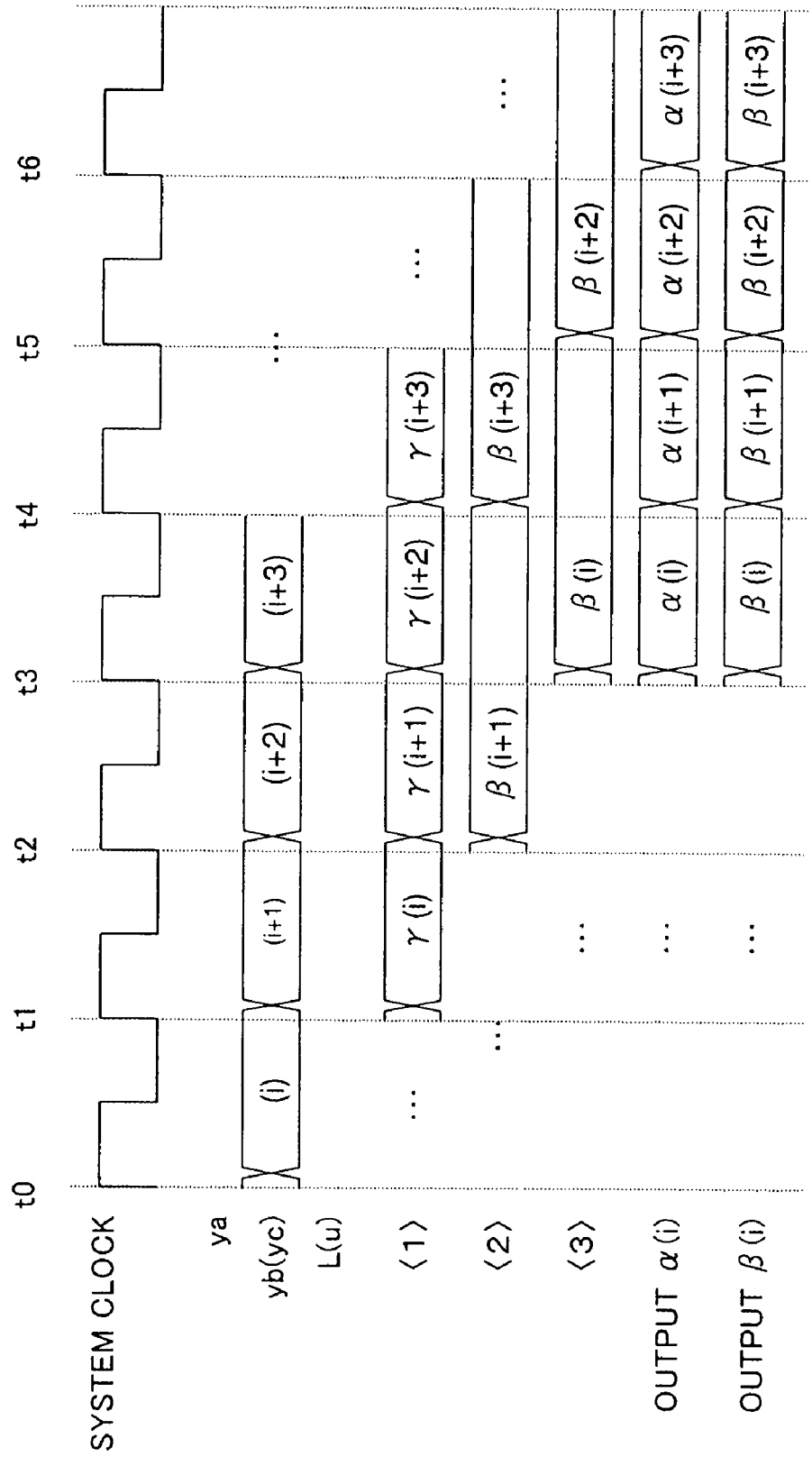
FIG. 10 is a timing chart for recalculating backward-probabilities in portions that are not saved in a memory.

The embodiment of the turbo decoding apparatus will hereinafter exemplify a configuration in a case of saving the calculation results of the backward-probabilities at intervals of one time (alternately), in which a thinning-out quantity n is set such as n=1. FIG. 8 shows a conceptual diagram of a process of the forward-probability calculation and re-executing a process of the backward-probability calculation, FIG. 9 illustrates an example of blocks of circuit units added to the Conventional Example, and FIG. 10 shows a timing chart of the recalculation of the portion that is not stored in the memory.

In FIG. 8, let $\gamma(i)$ be a shift-probability at time i, let $a(i)$ be a calculation result of a forward-probability (forward-probability) at the time i, and let $\beta(i)$ be a calculation result of a backward-probability (backward-probability) at the time i. A system according to the embodiment involves previously executing the backward-probability calculation in the same way as by the conventional system. In this embodiment, however, the calculation results of the backward-probability calculation are saved (buffered: stored) alternately (n=1). Herein, an assumption is that $\beta(i+1)$, $\beta(i+3)$, . . . are saved as the calculation results of the backward-probabilities ($\beta(i+2)$, $\beta(i)$ are thinned out).

An i-th joint-probability is calculated at the time i. Herein, a forward-probability a at each time is in a status where the calculated result thereof has already been retained. Namely, such a status exists, in which the forward-probability $a(i)$ is acquired. The backward-probability $\beta(i)$ is not stored in the memory (backward-probability RAM) for storing the calculation results of the backward-probabilities, and hence a joint-probability of the forward-probability $a(i)$ and the backward-probability $\beta(i)$ cannot be calculated.

Therefore, the i-th joint-probability is not calculated at the timing of the time i, and the operation shifts to time i+1 while retaining the shift-probability $\gamma(i)$ at the time i. A value of the backward-probability $\beta(i+1)$ is saved in the backward-probability RAM. Hence, the backward-probability $\beta(i)$ can be calculated (recalculated) by employing the backward-probability $\beta(i+1)$ and the shift-probability $\gamma(i+1)$ at the time i+1. The joint-probability at the time i can be calculated by using the backward-probability $\beta(i)$ and the forward-probability $a(i)$. Further, the joint-probability at the time i+1 can be calculated by use of the backward-probability $\beta(i+1)$ and the forward-probability $a(i+1)$. Note that the forward-probability $a(i+1)$ is calculated by employing the forward-probability $a(i)$ and the shift-probability $\gamma(i+1)$ at the time i+1.

The shift-probability $\gamma(i+1)$ is a value calculated for obtaining the forward-probability $a(i+1)$, the shift-probability for the recalculation may not be calculated by using this value for recalculating the backward-probability, and the process time can be reduced (an increase thereof can be restrained).

The blocks illustrated in FIG. 9 include a backward-probability calculation unit 10 that receives the shift-probability $\gamma$ from a shift-probability calculation unit 9 and also receives an input of the calculation result of the backward-probability stored in a backward-probability RAM 11 (storage unit). An output terminal of the backward-probability calculation unit 10 is connected to one input terminal of a selector 12, and the backward-probability RAM 11 is connected to the other input terminal of the selector 12 via a phase shifter 13. The selector 12 selects one of output terminals of the backward-probability calculation unit 10 and of the backward-probability RAM 11, and connects the selected output terminal as the backward-probability β(i) to a joint-probability calculation unit. Moreover, a forward-probability calculation unit 14 is connected to the shift-probability calculation unit 9 via a phase shifter 15, and outputs a forward-probability calculation result a(i). With this scheme, the forward-probability calculation result a(i) and the backward-probability calculation result β(i) at the same point of time are input to the joint-probability calculation unit (not shown) at the same timing.

The circuit illustrated in FIG. 9 operates according to a system clock as shown in FIG. 10, and the shift-probability calculation unit 9 outputs the shift-probability γ at each point of time, every clock cycle (<1> of FIGS. 9 and 10). In contrast with this, the backward-probability calculation result β at a certain point of time is read at every 2-clock cycle from the backward-probability RAM 11 (<2> of FIGS. 9 and 10). The example shown in FIG. 10 is that β(i+1), β(i+3) stored at the intervals of one time point are read at the 2-clock cycle.

In the second half of the time for reading one backward-probability calculation result (at the second half of the 2-clock cycle during the read-access to the RAM 11), the forward-probability a and the backward-probability β at a certain point of time are output, the forward-probability a and the backward-probability β at a next point of time are output at the next clock cycle, and the joint-probability at each point of time is calculated. In the example shown in FIG. 10, at output timing (timing t2) of the shift-probability γ(i+1) from the shift-probability calculation unit 9 (<1> of FIG. 10), the backward-probability calculation unit 10 reads the backward-probability β(i+1) saved in the backward-probability RAM 11 (<2> of FIG. 10), and recalculates the backward-probability β(i). The backward-probability calculation unit 10, at output timing (timing t3) of the next shift-probability γ(i+2), outputs the backward-probability β(i) (<3> of FIG. 10). The backward-probability calculation unit 10 changes the output at every 2-clock cycle.

At the timing t3, the backward-probability β(i) is output as a selected output from the selector 12. On the other hand, the shift-probability γ(i) output at the timing t1 from the shift-probability calculation unit 9 is input by the phase shifter 15 to the forward-probability calculation unit 14 with a 1-cycle delay. The forward-probability calculation unit 14 outputs the forward-probability a(i) at the next output timing (timing t3). Hence, the forward-probability a(i) and the backward-probability β(i) are input at the same timing to the joint-probability calculation unit.

The backward-probability β(i+1) read as an output <2> from the backward-probability RAM 11 reaches, via the phase shifter 13, the selector 12 with the 1-cycle delay. The selector 12 changes over the output at the intervals of one cycle. Hence, at timing t4, the backward-probability β(i+1) from the phase shifter 13 is output from the selector 12. On the other hand, the shift-probability is input to the forward-probability calculation unit 14 with the 1-cycle delay behind the backward-probability calculation unit 10, and hence it follows that the forward-probability a(i+1) is output at timing t4. Therefore, the forward-probability and the backward-probability at the same point of time are input at the same timing to the joint-probability calculation unit.

Thus, in the first half of the reading time of the backward-probability β(i+1), the backward-probability β(i) is recalculated, and, in the second half of the reading time, the backward-probability β(i) and the forward-probability a(i) are output. Then, at the next cycle, the backward-probability β(i+1) and the forward-probability a(i+1) are output.

Thus, in this embodiment, the two joint-probabilities can be calculated once at the 2-clock cycle, and it is understood that the backward-probability can be recalculated and the memory capacity can be reduced simply by adding the calculation units executing the backward-probability calculation results, which are not saved in the memory (the backward-probability RAM), in a way that takes the configuration of processing the probability calculations on a time-division basis.

In the Conventional Example 2 or 3, when arithmetically operated at every system clock (per clock cycle), there is simultaneous occurrence of the write-access to the memory (the backward-probability RAM) stored with the backward-probability calculation results and the read-access for calculating the joint-probability by reading the backward-probability calculation results stored therein. Hence, the avoidance of the access conflict entails separating the write-access from the read-access by taking a dual configuration of the memories (the a posteriori probability RAMs).

A system according to this embodiment is that the backward-probability calculation results are thinned out at the intervals of n-time point and thus stored in the memory. This scheme eliminates the necessity of taking the dual-memory configuration because of performing the writing operation once at an n+1 cycle and the reading operation once at the n+1 cycle.

This scheme is combined with a point that the memory saving capacity becomes 1/(n+1), resulting in an effect in reducing the memory capacity by ½(n+1). An increasing quantity of the circuit scale is equivalent to an n-increase in the number of the backward-probability calculation units for performing the recalculation. The calculation of the backward-probability is attained by addition and selection of a maximum value, and hence the circuit configuration is comparatively simple. Accordingly, the increase quantity of the circuit scale is sufficiently small for the reduction quantity of the memory capacity.

Further, an increase in the process time is on the order of a several-clock cycle, and this increase quantity over the conventional process time is minute, with the result that the characteristic of the error rate is absolutely the same because of a difference between storing in the memory and re-executing the same calculation.

SPECIFIC EXAMPLE

The configuration according to the embodiment of the present invention illustrated in FIGS. 8 to 10 can be applied to each of the systems exemplified in the Conventional Examples 1 through 4. The scheme of the Conventional Example 4 is to speed up the processing by executing the parallel process in a way that segments N-bit coded data having an information length N into M-pieces of blocks in the respective systems in the Conventional Examples 1 through 3. With this scheme, the present system can be applied to the respective systems in the Conventional Examples 1 through 3, and can be also applied after applying the Conventional Example 4 to the Conventional Examples 1 through 3.

Specific Example 1

An example in a case of applying the present system to what the speed-up is attained by applying the Conventional Example 4 to the Conventional Example 1, will be described as a Specific Example 1. Herein, in order to simplify the description, the Specific Example 1 includes a case of conducting 1-fold speed-up in the Conventional Example 4, i.e., a case where the Conventional Example 4 is not applied.

Figure 11:
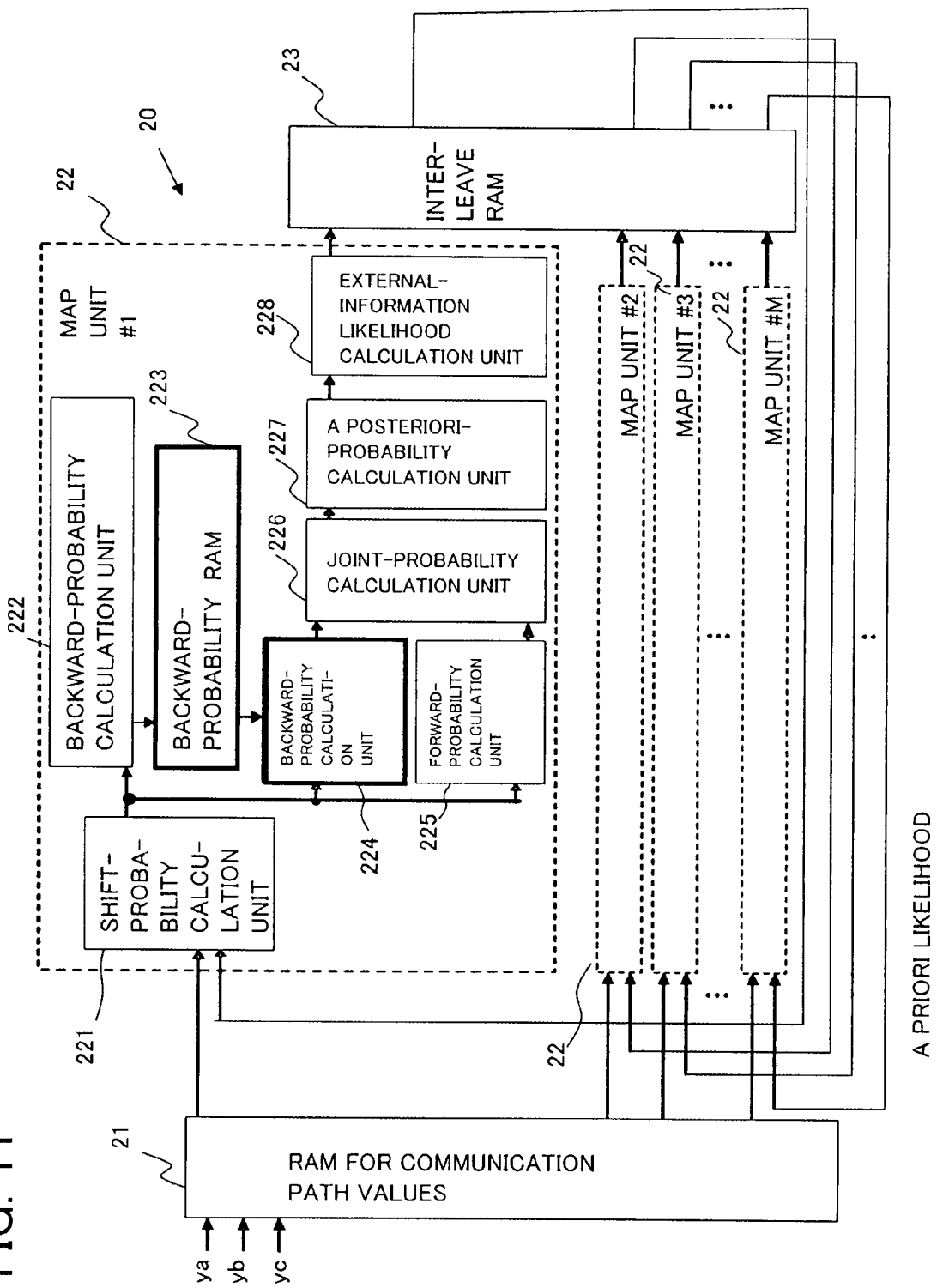
FIG. 11 is a diagram showing an example of a configuration of a turbo decoding apparatus of a Specific Example 1 of the embodiment of the present invention.

FIG. 11 is a block diagram showing a turbo decoding apparatus in the case of applying the Conventional Example 4 to the Conventional Example 1 and further applying the system according to this embodiment. As illustrated in FIG. 11, a turbo decoding apparatus 20 includes a communication path value RAM 21, a plurality of MAP units (MAP decoders) 22(#1 to #M), and an interleave RAM 23.

Pieces of reception data (reception signals) ya, yb, yc are input to the communication path value RAM 21. The communication path value RAM 21 can store the reception data ya, yb, yc and can selectively output the data. Namely, the communication path value RAM 21 can output the pieces of reception data ya, yb when starting the turbo decoding process, and thereafter can output the reception data yc after finishing the first half of the turbo decoding process.

The interleave RAM 23 can store element decoded results given from the respective MAP units 22, can perform interleaving and deinterleaving alternately, and can feed interleaved/deinterleaved results back to shift-probability calculation units 221 of the MAP decoders 22.

Figure 1:
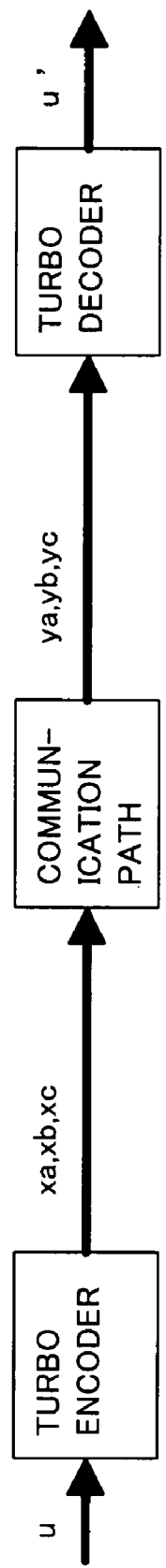
FIG. 1 is a diagram showing an example of a communication system including a turbo encoder and a turbo decoder.
Figure 2:
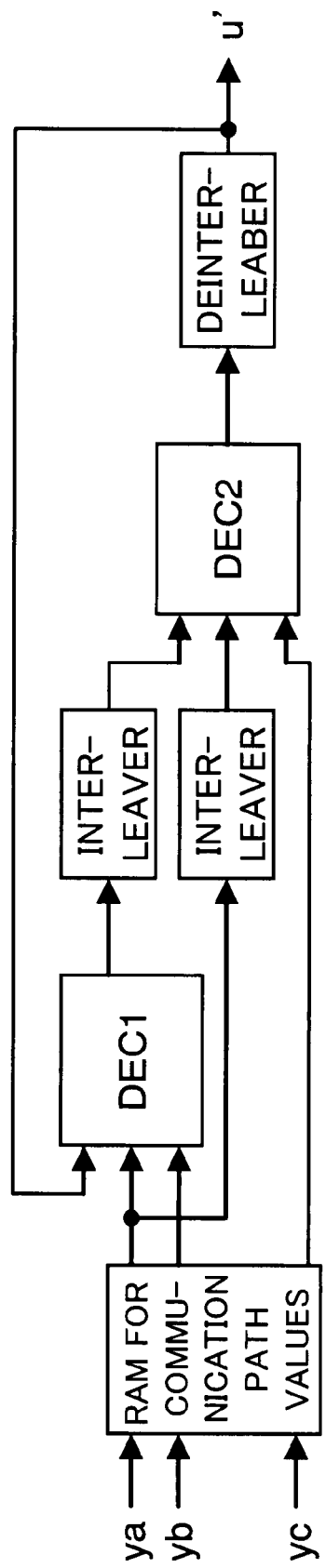
FIG. 2 is a diagram showing an example of a configuration of the turbo decoder (turbo decoding apparatus).
Figure 3:
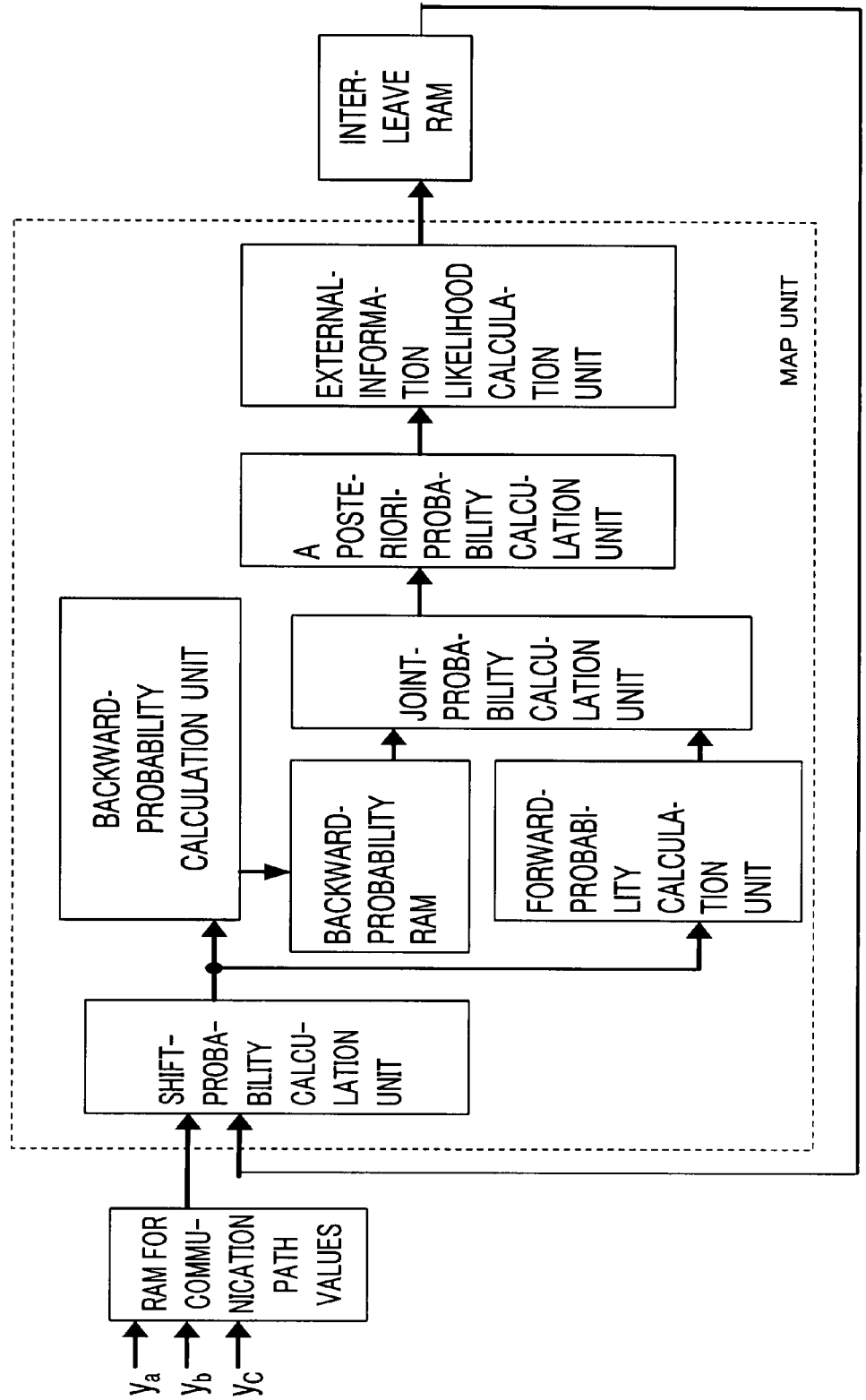
FIG. 3 is a diagram showing an example of the configuration of the turbo decoding apparatus to which MAP is applied.
Figure 4:
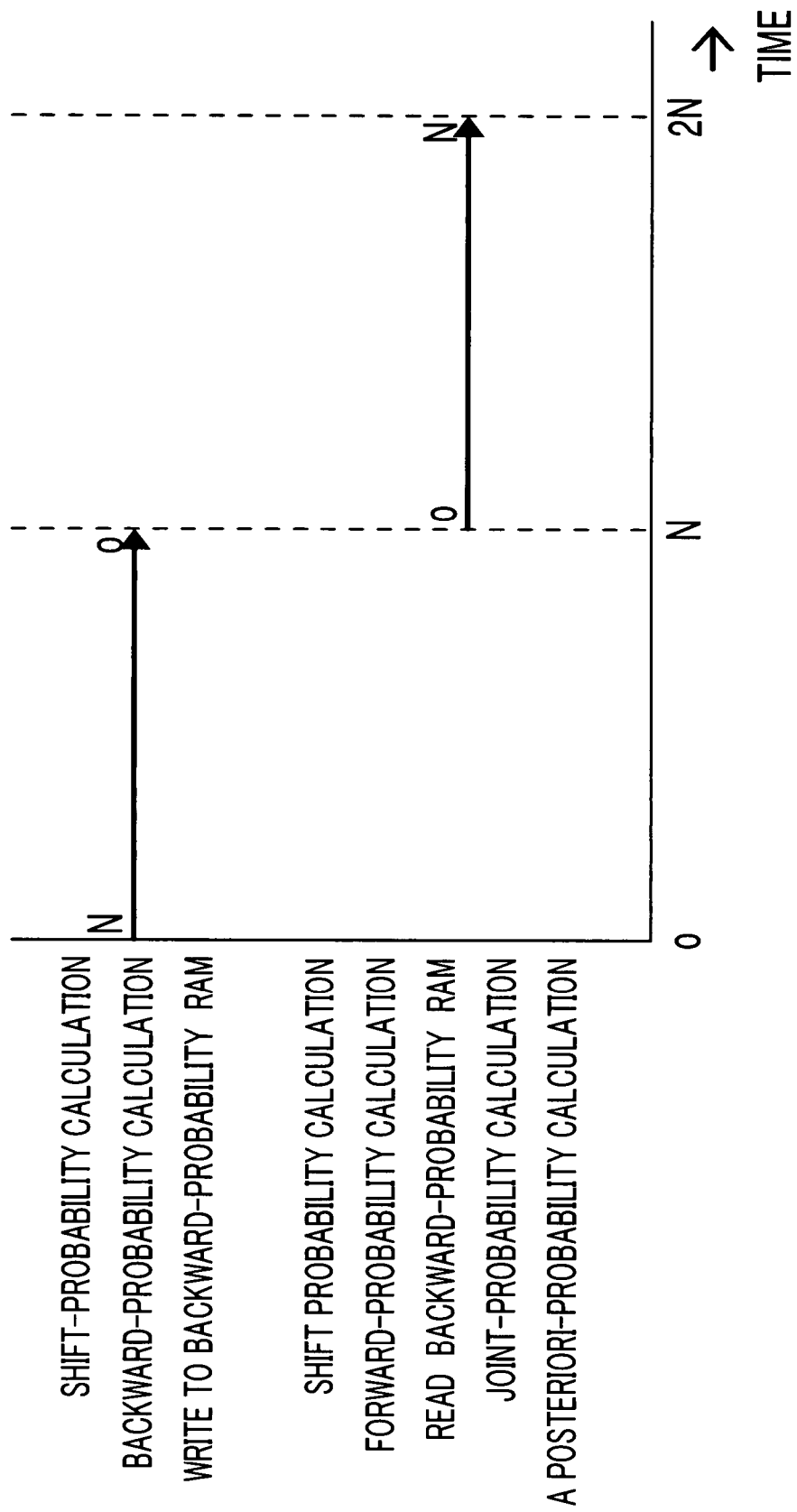
FIG. 4 is a timing chart showing a single MAP decoding process performed in a Conventional Example 1.

The MAP unit #1 is alternately used as first and second component decoders in FIG. 2, i.e., as a component decoder (DEC 1) for the first half of the turbo decoding process and a component decoder (DEC 2) for the second half thereof. The MAP unit #2 alternately is employed as the DEC 1 and the DEC 2 in FIG. 2. Each of the MAP units #3 to #M is alternately employed as the DEC 1 and the DEC 2 in FIG. 2.

The interleave RAM 23 is alternately used as an interleaver and a deinterleaver in FIG. 2. Each of the MAP units #1 to #M has the same construction and includes a shift-probability calculation unit 221, a first backward-probability calculation unit 222, a backward-probability RAM 223 serving as a storage unit, a second backward-probability calculation unit 224, a forward-probability calculation unit 225, a joint-probability calculation unit 226, an a posteriori probability calculation unit 227, and an external information likelihood calculation unit 228. The joint-probability calculation unit 226, the a posteriori probability calculation unit 227, and the external information likelihood calculation unit 228 correspond to a decoded result calculation unit (means) of the present invention.

The backward-probability RAM 223 and the second backward-probability calculation unit 224 have improved or added configurations in order to realize the system according to this embodiment, and the second backward-probability calculation unit 224 has, in detail, a configuration depicted by a broken line in FIG. 9. Namely, the backward-probability RAM 223 corresponds to the backward-probability RAM 11 of FIG. 9, and the second backward-probability calculation unit 224 has the configuration circumscribed by the broken line of FIG. 9. Further, the shift-probability calculation unit 221 and the forward-probability calculation unit 225 correspond to the shift-probability calculation unit 9 and the forward-probability calculation unit 14 of FIG. 9.

In the Specific Example 1, if a signal length (information length), in which a tail bit is added to information bits, has N bits (an N-bit decoding target signal (coded data)), the communication path value RAM 21 segments the signal length into M-segments, and simultaneously inputs the N/M segmented data to each of the MAP units #1 to #M.

The MAP units #1 to #M execute the MAP decoding process simultaneously (in parallel) with respect to the segmented data 0 to N/M, N/M to 2N/M, ..., (M−1)N/M to N that are segmented by N/M bits according to the MAP decoding method in the Conventional Example 1.

To be specific, in the first MAP unit #1, the shift-probability calculation unit 221 and the backward-probability calculation unit 222 calculate the shift-probabilities and the backward-probabilities from time point N/M+Δ toward time point 0, and the backward-probability calculation unit 222 stores and retains the calculation results of the backward-probabilities from time point N/M−1 to the time point 0 at intervals of n-time (e.g., n=1) in the backward-probability RAM 223. Note that the backward-probabilities from N/M+Δ to N/M have no reliability and are therefore discarded.

Next, the shift-probability calculation unit 221 and the forward-probability calculation unit 225 calculate the shift-probabilities and the forward-probabilities from the time point 0 toward time point N/M−1. Herein, if the calculation results of the backward-probabilities are stored in the backward-probability RAM 223, the values thereof are input to the joint-probability calculation unit 226 from the backward-probability calculation unit 224. On the other hand, if the calculation results of the backward-probabilities are not stored in the backward-probability RAM 223, the backward-probability calculation unit 224 calculates a desired calculation result of the backward-probability from the calculation results of the backward-probabilities stored in the backward-probability RAM 223 and from the calculation result of the shift-probability at that time, and inputs the thus-calculated result to the joint-probability calculation unit 226.

For example, if the calculation result of the backward-probability at time i is not stored in the backward-probability RAM 223, the backward-probability calculation unit 224 recalculates a backward-probability calculation result β(i) at the time i from a backward-probability calculation result β(i+1) at time i+1 and from a shift-probability calculation result γ(i+1) at that time, and inputs the backward-probability calculation result β(i) to the joint-probability calculation unit 226. The joint-probability calculation unit 226 calculates a joint-probability by use of the backward-probability calculation result and the forward-probability calculation result, and the a posteriori probability calculation unit 227 and the external information likelihood calculation unit 228 calculate the a posteriori-probability and the external information likelihood, respectively.

Note that the reason why the calculation of the backward-probability starts not from time N/M but from time N/M+Δ is elucidated as below. In the calculation of the backward-probability, the probability at time N/M is calculated, and hence the backward-probability is calculated based on a probability at time N/M+1. Therefore, if the backward-probability at N/M+1 is not calculated correctly, the backward-probability at N/M cannot be calculated correctly. Such being the case, the calculation of the backward-probability at N/M+Δ uses a proper value as an initial value, and the backward-probabilities are calculated in the sequence of N/M+(Δ−1), N/M+(Δ−2), N/M+(Δ−3), ... N/M+2, N/M+1, N/M. The calculation is thus performed, thereby obtaining the calculation results of the backward-probabilities exhibiting higher reliability, sequentially. Subsequently, the reliable calculation results are acquired at N/M−1, N/M−2 ... because of being calculated from N/M with the reliability.

Moreover, in the i-th MAP unit #i, the shift-probability calculation unit 221 and the backward-probability calculation unit 222 calculate the shift-probabilities and the backward-probabilities from time iN/M+L toward time (i−1)N/M, and the backward-probability calculation unit 222 stores and retains the calculation results of the backward-probabilities from the time iN/M−1 to time (i−1)N/M at the intervals of one time (alternately) in the backward-probability RAM 223. Note that the backward-probabilities from time iN/M+Δ to time iN/M are not reliable and are therefore discarded.

Next, the shift-probability calculation unit 221 and the forward-probability calculation unit 225 calculate the shift-probabilities and the forward-probabilities from time (i−1)N/M−Δ toward time iN/M−1.

The joint-probability calculation unit 226, in parallel with calculating the forward-probabilities from time (i−1)N/M to time iN/M−1, acquires the calculation results of the backward-probabilities from the backward-probability calculation unit 224, and executes joint-probability calculation by use of the backward-probabilities and the forward-probabilities. At this time, the backward-probability calculation unit 224 outputs the values stored in the backward-probability RAM 223 to the joint-probability calculation unit 226, then recalculates non-stored values by the same method as by the MAP unit #1, and outputs a recalculated result to the joint-probability calculation unit 226. The a posteriori calculation unit 227 and the external information likelihood calculation unit 228 execute the a posteriori-probability calculation and the external information likelihood calculation, respectively.

Note that the reason why the calculation of the forward-probability is conducted not from time (i−1)N/M but from time (i−1)N/M−Δ is elucidated as below. In the forward-probability calculation, the forward-probability at time N/M is calculated based on the forward-probability at time N/M−1. Therefore, if the forward-probability at N/M−1 is not calculated correctly, the forward-probability at N/M can not be calculated correctly. Such being the case, a result of the forward-probability calculation at the time N/M-B uses a proper value as an initial value, and the forward-probabilities are calculated in the sequence of N/M−(Δ−1), N/M−(Δ−2), N/M−(Δ−3), N/M−2, N/M−1, N/M. The calculation is thus performed, thereby obtaining the calculation results of the forward-probabilities exhibiting higher reliability, sequentially. Subsequently, the reliable calculation results are acquired at N/M+1, N/M+2, . . . because of being calculated from N/M with the reliability.

Moreover, in the M-th MAP unit #M, the shift-probability calculation unit 221 and the backward-probability calculation unit 222 calculate the shift-probabilities and the backward-probabilities from time N−1 toward time (M−1)N/M, and the backward-probability calculation unit 222 stores and retains the calculation results of the backward-probabilities from time N−1 to time (M−1)N/M at the intervals of one time in the backward-probability RAM 223.

Next, the shift-probability calculation unit 221 and the forward-probability calculation unit 225 calculate the shift-probabilities and the forward-probabilities from time (M−1)N/M−Δ toward time N, respectively.

The joint-probability calculation unit 226, in parallel with calculating the a priori probabilities from time (M−1)N/M to time N−1, acquires the calculation results of the backward-probability calculation from the backward-probability calculation unit 224, and executes the joint-probability calculation by employing the results of the backward-probability calculation and the results of the forward-probability calculation.

At this time, the backward-probability calculation unit 224 outputs the values stored in the backward-probability RAM 223 to the joint-probability calculation unit 226, then recalculates non-stored values by the same method as by the MAP unit #1, and outputs a recalculated result to the joint-probability calculation unit 226. The a posteriori-probability calculation unit 227 and the external information likelihood calculation unit 228 execute the a posteriori-probability calculation and the external information likelihood calculation, respectively.

The respective MAP units #1 to #M perform the MAP decoding operation in parallel, the interleave RAM 23 stores the decoded result of each MAP unit in a predetermined storage area of the built-in RAM, and M-tuples of data are simultaneously read (interleaved or deinterleaved) in a predetermined sequence from the RAM units, thereby executing the turbo decoding by repeating the operation a plural number of times.

Each MAP unit operates as follows. The shift-probability calculation unit 221 calculates the shift-probability at each point of time i by use of the reception data, and inputs the shift-probability calculation result γ(i) to the first backward-probability calculation unit 222 and the second backward-probability calculation unit 224.

The first backward-probability calculation unit 222 calculates the backward-probability at each point of time i in a predetermined segment in the N-bit, and stores the calculation results of the backward-probabilities at the intervals of the n-pieces of probabilities in the backward-probability RAM 223. Herein, with respect to the MAP units #1, #2, #3, . . . , #M, the N-bit decoding target signal (coded data) is segmented into M-pieces of signals (data), then each piece of segmented data is decoded by the corresponding MAP unit, and these element decoded results are bound by the interleave RAM 23.

The backward-probability calculation results β(i), which are thinned out at intervals of n-time (n=1 in this example) of probabilities in the backward-probability calculation results from time N/M−1 to time 0, are stored in the backward-probability RAM 223 of the MAP unit #1. For example, as illustrated in FIG. 8, β(i) and β(i+2) are the tinned-out probabilities, and β(i+1), β(i+3), β(i+5), . . . are stored in the backward-probability RAM 223.

The second backward-probability calculation unit 224, if the backward-probability calculation result (e.g., β(i)) at a certain point of time i is not stored in the backward-probability RAM 223, recalculates the backward-probability β(i) by use of the shift-probability γ(i+1) input from the shift-probability calculation unit 221 and the backward-probability calculation result β(i+1) at a time point (i+1) that is later than the time point i of the calculation result of the calculation target probability at one time point, which is stored in the backward-probability RAM 223, and outputs this backward-probability β(i). With this operation, the backward-probability calculation result stored in the backward-probability RAM 223 and one of the backward-probability calculation results recalculated by the second backward-probability calculation unit 224 are input, as the backward-probability calculation results β(i) at the respective points of time i, to the joint-probability calculation unit 226.

The forward-probability calculation unit 225 calculates the forward-probability at each point of time i in the predetermined time segment in N bits, and inputs the calculated probability as the forward-probability calculation result a(i) to the joint-probability calculation unit 226. The joint-probability calculation unit 226 calculates the joint-probability calculation result by multiplying the forward-probability calculation result by the backward-probability calculation result at the same point of time, and inputs the calculated joint-probability to the a posteriori-probability calculation unit 227.

The a posteriori-probability calculation unit 227 outputs a logarithmic likelihood (the a posteriori-probability L(u1k)) by use of the method described in the Conventional Example 1. The external information likelihood calculation unit 228 removes the a priori likelihood and the communication path value at the input time from the a posteriori-probability L(u1k), thereby calculating the external information likelihood Le(u1k). The external information likelihood Le(u1k) is stored in the interleave RAM 23, then interleaved, then output as the a priori likelihood Le(u1k') in the next decoding process, and fed back to the shift-probability calculation unit 221.

With the operations described above, the first half of the decoding process (one MAP decoding process) of the turbo decoding of the first time is terminated, next, what the reception data ya is interleaved and the a priori likelihood L(u1k') obtained in the first half of the decoding process are deemed to be new reception data ya', and the MAP decoding process is executed by employing ya' and yc, thereby outputting a likelihood L(u2k). So far, one turbo decoding process is terminated. The decoded results of the MAP units #1 to #M are stored in a predetermined area of the interleave RAM 23 and simultaneously read (interleaved or deinterleaved) in a predetermined sequence, then such a process is executed repeatedly a predetermined number of times (e.g., 8 times), then, if the acquired a posteriori-probability L(u8k)>0, a decoded result uk=1 is output, and, whereas if L(u8k)<0, a decoded result uk=0 is output.

Note that, if the N-bit coded data is not segmented into M-pieces of data, only one (e.g., the MAP unit #1) of the plurality of MAP units 22 is employed. In this case, the first backward-probability calculation unit 222 of the MAP unit #1 calculates the backward-probabilities from the time N toward the time 0, and stores the backward-probability calculation results from the time N to the time 0 at intervals of one probability in the backward-probability RAM 223.

Thus, the scheme in the Specific Example 1 involves executing the processes according to the Conventional Example 1 and writing the backward-probability calculation results to the backward-probability RAM (memory) 223. At this time, the Conventional Example 1 entails writing all of the backward-probability calculation results. By contrast, in the Specific Example 1, the backward-probability calculation results are written only at the intervals of n-time.

Further, on the occasion of calculating the joint-probability by use of the backward-probability calculation result, the joint-probability is calculated by using the value of the backward-probability read from the backward-probability RAM 223 with respect to the portion written to the RAM 223. In this point, with respect to the portion (e.g., β(i)) that is not written to the RAM 223, the second backward-probability calculation unit 224 recalculates the backward-probability by use of the value (β(i+1)) written to the RAM 223 and the shift-probability calculation result (γ(i+1)) for the forward-probability calculation, and the joint-probability is calculated by employing this recalculated result.

Figure 12:
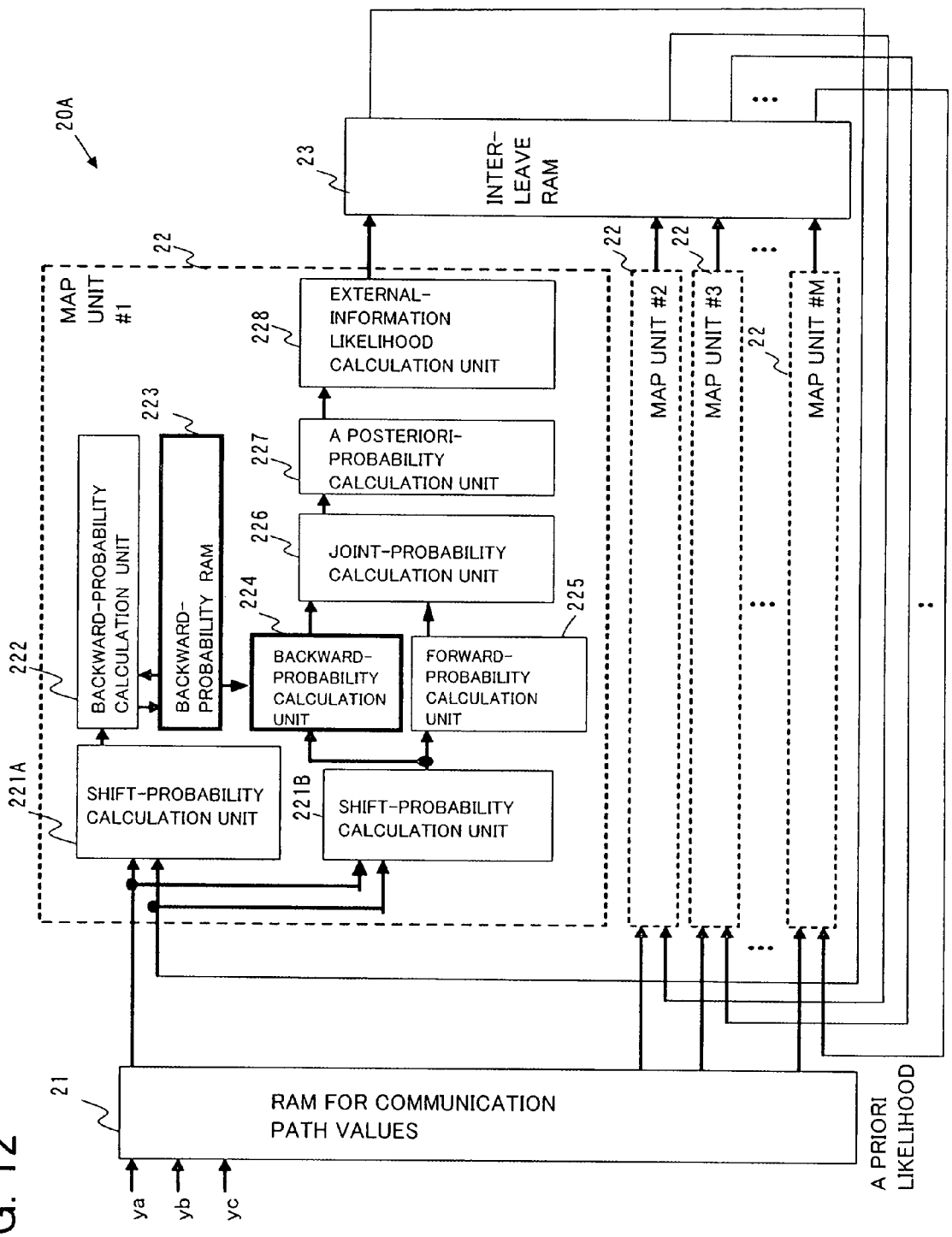
FIG. 12 is a diagram showing an example of the configuration of a turbo decoding apparatus of a Specific Example 2 of the embodiment of the present invention.

In FIG. 12, the backward-probability RAM 223 and the second backward-probability calculation unit 224 are the components changed from the Conventional Example 1. In the case of a combination of the Conventional Examples 1 and 4 (1+4), a size (memory capacity) of the backward-probability RAM is given by M(N/M) through M(N/M/(n+1)) and has a 1/(n+1) scale (memory capacity). On the other hand, it follows that the increase quantity of the circuit scale is equivalent to an M-increase in the number of the backward-probability calculation units (the calculation units 224). If n takes a small value to some extent, however, the memory reduction quantity takes a large value as compared with the increase quantity in the number of the backward-probability calculation units, and hence a circuit scale-down effect of the whole turbo decoding device can be expected.

Specific Example 2

Next, a case of applying the system according to this embodiment to the turbo decoding apparatus attaining the speed-up by applying the Conventional Example 4 to the Conventional Example 2 (the Conventional Examples 2+4) will be described as a Specific Example 2. Herein, in order to simplify the description, the Specific Example 2 includes a case of conducting the 1-fold speed-up in the Conventional Example 4, i.e., a case where the Conventional Example 4 is not applied.

FIG. 12 is a block diagram illustrating the turbo decoding apparatus, in which the system according to the embodiment is applied to the Conventional Examples 2 and 4 (2+4). A turbo decoding apparatus 20A illustrated in FIG. 12 has the configuration common to the turbo decoding apparatus 20 shown in FIG. 11, so the description will be focused mainly on a different configuration, while the description of the common configuration is omitted.

In FIG. 12, in the turbo decoding apparatus 20A, the decoding target signal (coded data) of N bits containing the tail bit is segmented into M-pieces of blocks, and the segmented signals (data) are subjected to the decoding process in the corresponding MAP units 22 (the MAP decoders #1 to #M).

Each MAP unit 22 has the same construction and is different from the Specific Example 1 of the following points. The MAP unit 22 is provided with two shift-probability calculation units 221A and 221B. Further, the backward-probability RAM 223 has a first storage area and a second storage area. The first storage area is stored with discrete backward-probability calculation results (discrete β). The second storage area is stored with continuous backward-probability calculation results (continuous β) in the Conventional Example 2. In the Specific Example 2, however, in the area, which is stored with the continuous backward-probability calculation results in the Conventional Example 2, the backward-probability calculation results are stored at the intervals of n-time (e.g., intervals of one time point).

In the Specific Example 2, if the signal length, in which the tail bit is added to the information bits, is an N-bit length, the communication path value RAM 21 segments (divides) the signal length into M-pieces of blocks and inputs the segmented data (blocks) simultaneously to the respective MAP units #1, #2, . . . , #M. The MAP units #1, #2, . . . , . . . #M execute, in accordance with the MAP decoding method in the Conventional Example 2, the MAP decoding process simultaneously (in parallel) with respect to the segmented pieces of data of 0 to N/M, N/M to 2N/M, . . . , (M−1)N/M to N, which are segmented by N/M bits.

An operational example of the Specific Example 2 will be explained with reference to FIG. 7. A different point of the operational example from the Conventional Examples 2 and 4 (2+4) is that the time segments (sections) (time segments L1 to 0, L1 to N/M. L1 to N(M−1)/M in FIG. 7), which are continuously stored with the backward-probability calculation results in the Conventional Example 2, are stored with the backward-probability calculation results at the intervals of n-times, and the backward-probability calculation unit 224 recalculates the backward-probability calculation results that are not stored therein.

The first MAP unit #1 shown in FIG. 12 executes the following process.

Figure 7:
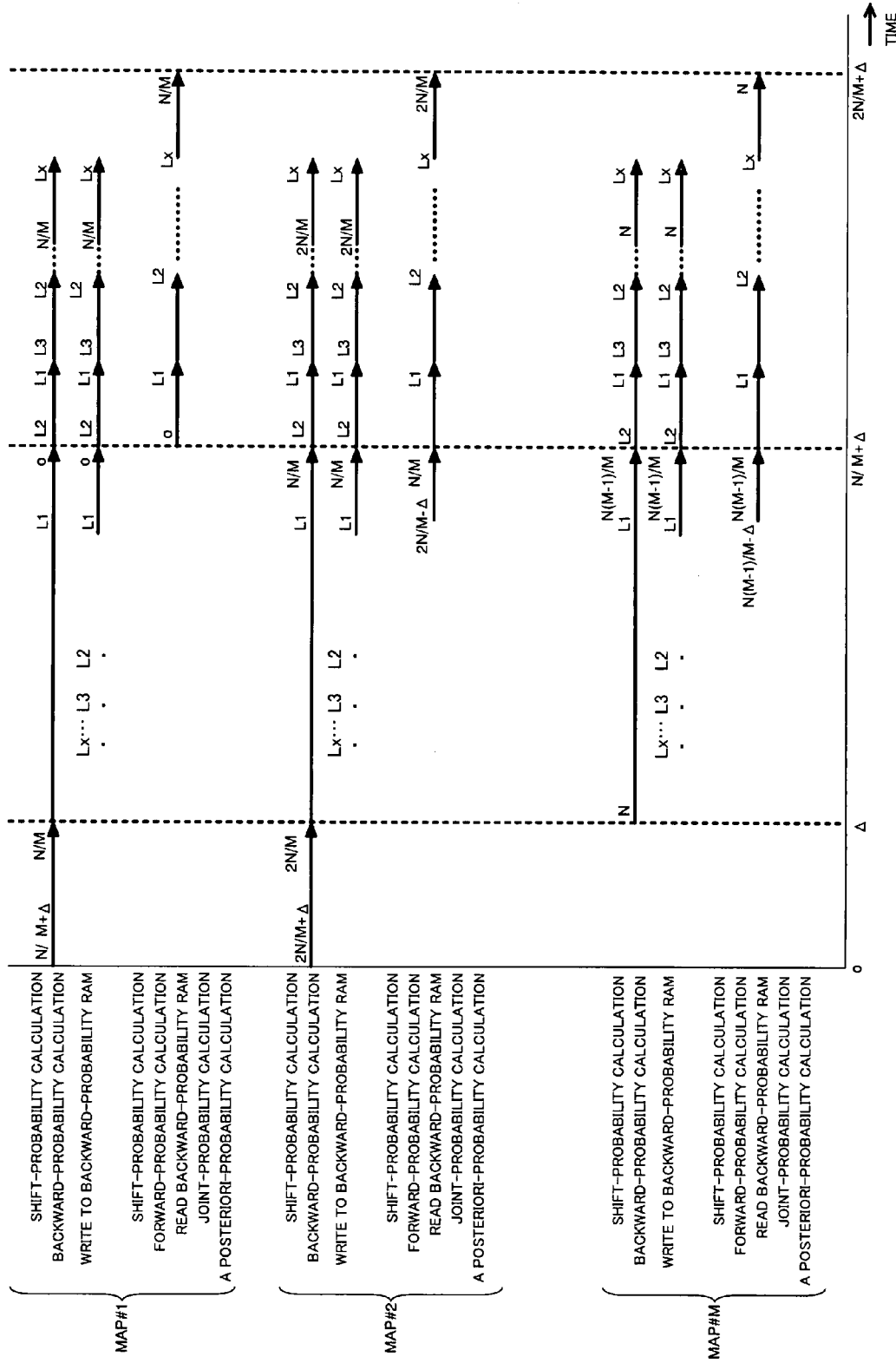
FIG. 7 is a timing chart when applying the system of a Conventional Example 4 to the Conventional Example 2.

<1> The shift-probability calculation unit 221A and the backward-probability calculation unit 222 calculate the shift probabilities and the backward-probabilities from time N/M+Δ toward time 0, and stores and retains the discrete backward-probability calculation results (discrete backward-probabilities β per L, which correspond to times Lx, . . . , L3, L2 in the MAP#1 of FIG. 7) in each of times N/M−1, N/M−L−1, N/M−2L−1, N/M−3L−1, . . . , 2L−1 in the first storage area of the backward-probability RAM 223. Further, the backward-probability calculation results from time L−1 to time 0 (which correspond to the backward-probability calculation results in time L1 to time 0 in the MAP#1 of FIG. 7) are stored and retained, at the intervals of one time, in the second storage area of the backward-probability RAM 223.

<2> The shift-probability calculation unit 221B and the forward-probability calculation unit 225 calculate the shift-probabilities and the forward-probabilities from the time 0 toward the time L−1(L1−1), then the joint-probability calculation unit 226 calculates the joint-probability by receiving the backward-probability calculation results from the backward-probability calculation unit 224, and the a posteriori-probability calculation unit 227 and the external information likelihood calculation unit 228 calculate the a posteriori-probability and the external information likelihood, respectively.

In this case, the joint-probability calculation unit 226, if the backward-probability calculation results are stored in the first storage area of the backward-probability RAM 223, receives the values stored therein from the backward-probability calculation unit 224. Whereas if the backward-probability calculation results are not stored in the first storage area of the backward-probability RAM 223, the backward-probability calculation unit 224 recalculates a desired backward-probability calculation result from the backward-probability calculation results stored in the backward-probability RAM 223 and from the shift probability calculation result at that time, and the recalculated backward-probability calculation result is input to the joint-probability calculation unit 226 (see FIGS. 8, 9, and 10).

<3> After finishing the MAP decoding process from the time 0 to the time L−1(L1−1), or in parallel with this MAP decoding process, the backward-probability calculation unit 222 reads the backward-probability calculation result in the time 2L−1 (which corresponds to time L2 in MAP#1 of FIG. 7) from the first storage area, and, by using this backward-probability as an initial value, the shift-probability calculation unit 221A and the backward-probability calculation unit 222 store and retain the backward-probability calculation results at the intervals of one time point in the second storage area while calculating the shift-probabilities and the backward-probabilities from time 2L−1 to time L(which correspond to time L2 through time L1in MAP#1 of FIG. 7).

<4> Next, the shift-probability calculation unit 221 Band the forward-probability calculation unit 225 calculate the shift-probabilities and the forward-probabilities from the time L toward the time 2L−1 (which corresponds to L1 >L2 in FIG. 7), then the joint-probability calculation unit 226 calculates the joint-probability by receiving the backward-probability calculation results from the backward-probability calculation unit 224, and the a posteriori-probability calculation unit 227 and the external information likelihood calculation unit 228 execute the a posteriori-probability calculation and the external information likelihood calculation, respectively. In this case, the backward-probability calculation unit 224, if the backward-probability calculation result is stored in the second storage area of the backward-probability RAM 223, provides a value thereof to the joint-probability calculation unit 226. Whereas if the backward-probability calculation result is not stored in the second storage area, the backward-probability calculation unit 224 provides the backward-probability calculation result obtained through the recalculation to the joint-probability calculation unit 226.

<5> The external information likelihoods from 0 to N/M−1 are calculated by repeating the same processes in <3> and <4> on the L-by-L basis.

Further, the i-th MAP decoder #i executes the following processes.

<1> The shift-probability calculation unit 221A and the backward-probability calculation unit 222 calculate the shift-probabilities and the backward-probabilities from time iN/M+L toward time (i−1)N/M (which corresponds the time 2N/M+Δ−>the time N/M of MAP#2 of FIG. 7), and store and retain the discrete backward-probability calculation results (discrete backward-probabilities B per L: corresponding to times Lx, . . . , L3, L of MAP#2 of FIG. 7) in the times iN/M−1, iN/M−L−1, iN/M−2L−1, iN/M−3L−1, . . . , (i−1)N/M+2L−1 in the first storage area of the backward-probability RAM 223. Moreover, the backward-probability calculation results from the time (i−1)N/M+L−1 to the time (i−1)N/M (which correspond to the backward-probability calculation results from the time L1 to the time N/M) are stored and retained at the intervals of one time in the second storage area of the backward-probability RAM 223.

<2> Next, the shift-probability calculation unit 221 Band the forward-probability calculation unit 225 calculate the shift-probabilities and the forward-probabilities from the time (i−1)N/M−Δtoward the time (i−1)N/M (which corresponds to the time 2N/M−Δ-> the time N/M of MAP#2 of FIG. 7), and subsequently calculate the shift-probabilities and the forward-probabilities from the time (i−1)N/M toward the time (i−1)N/M+L−1 (which corresponds to the time N/M-> the time L1).

The joint-probability calculation unit 226 calculates the joint-probability by receiving the backward-probability calculation result from the backward-probability calculation unit 224, and the a posteriori-probability calculation unit 227 and the external information likelihood calculation unit 228 execute the a posteriori-probability calculation and the external information likelihood calculation, respectively. At this time, the backward-probability calculation unit 224 executes the same process as in the case of the backward-probability calculation unit 224 of the MAP unit #1.

<3> After finishing the MAP decoding process from the time (i−1)N/M to the time (i−1)N/M+L−1 (which corresponds to the time 2N/M through the time N/M), or in parallel with this MAP decoding process, the backward-probability calculation unit 222 reads the backward-probability calculation result in the time (i−1)N/M+2L−1 (which corresponds to L2 in FIG. 7) from the first storage area, and by using the backward-probability as an initial value, the shift probability calculation unit 221A and the backward-probability calculation unit 222 store and retain the backward-probability calculation results in the second storage area while calculating the shift probabilities and the backward-probabilities from the time (i−1)N/M+2L−1 toward the time (i−1)N/M+L (which correspond to L2−>L1).

Next, the shift probability calculation unit 221B and the forward-probability calculation unit 225 calculate the shift-probabilities and the forward-probabilities from the time (i−1)N/M+L toward the time (i−1)N/M+2L−1 (which corresponds to L1->L2), then the joint-probability calculation unit 226 calculates the joint-probability by receiving the backward-probability calculation result from the backward-probability calculation unit 224, and the a posteriori-probability calculation unit 227 and the external information likelihood calculation unit 228 calculate the a posteriori-probability and the external information likelihood, respectively.

<4> Hereinafter, the external information likelihoods from the time (i−1)N/M to the time iN/M−i (which corresponds to L2->2N/M) are calculated by repeating the processes on the L-by-L basis in the same way as in <3>.

Further, the M-th MAP decoder #M performs the following operations.

<1> The shift-probability calculation unit 221A and the backward-probability calculation unit 222 calculate the shift-probabilities and the backward-probabilities from the time N−i to the time (M−i)N/M (which corresponds to the time N−>the time N(M−1)/M of MAP#M of FIG. 7), then store and retain the discrete backward-probability calculation results in the times N−L−1, N−2L−1, N−3L−1, . . . , and (M−)N/M+2L−1 (backward-probabilities B: corresponding to the times Lx, . . . , L3, L2 of MAP#M of FIG. 7) in the first storage area of the backward-probability RAM 223, and also store and retain the backward-probability calculation results from the time (M−1)N/M+L−1 to the time (M−1)N/M (which correspond to the backward-probability calculation results from the time L1 to the time N(M−1)/M of MAP#M of FIG. 7) at the intervals of one time in the second storage area of the backward-probability RAM 223.

<2> Next, the shift probability calculation unit 221B and the forward-probability calculation unit 225 calculate the shift-probabilities and the forward-probabilities from the time (M−1)N/M−B toward the time (M−1)N/M (which correspond to N(M−1)/M−Δ−>N(M−1)/M), and subsequently calculate the shift-probabilities and the forward-probabilities from the time (M−1)N/M toward the time (M−1)N/M+L−1 (which corresponds to N(M−1)/M−>L1). The joint-probability calculation unit 226 calculates the joint-probability by receiving the backward-probability calculation result from the backward-probability calculation unit 224, and the a posteriori-probability calculation unit 227 and the external information likelihood calculation unit 228 execute the a posteriori-probability calculation and the external information likelihood calculation, respectively.

<3> After finishing the MAP decoding process from the time (M−1)N/M to the time (M−1)N/M+L−1 ((M−1) N/M−>L1), or in parallel with this MAP decoding process, the backward-probability calculation unit 222 reads the backward-probability calculation result in the time (M−1)N/M+2L−1 (which corresponds to the backward-probability calculation results of L2) from the first storage area, and by using the backward-probability as an initial value, the shift-probability calculation unit 221A and the backward-probability calculation unit 222 store and retain the backward-probability calculation results in the second storage area while calculating the shift-probabilities and the backward-probabilities from the time (M−1)N/M+2L−1 toward the time (M−1)N/M+L(which corresponds to L2->L1).

Next, the shift-probability calculation unit 221B and the forward-probability calculation unit 225 calculate the shift-probabilities and the forward-probabilities from the time (M−1)N/M+L toward the time (M−1)N/M+2L−1 (which corresponds to L1->L2), then the joint-probability calculation unit 226 calculates the joint-probability by receiving the backward-probability calculation result from the backward-probability calculation unit 224, and the a posteriori-probability calculation unit 227 and the external information likelihood calculation unit 228 execute the a posteriori-probability calculation and the external information likelihood calculation, respectively.

<4> Hereinafter, the external information likelihoods from the time (M−1)N/M to the time N−1 (L2->N) are calculated by repeating the processes on the L-by-L basis in the same way as in <3>.

The respective MAP units #1, #2, . . . , #M perform the MAP decoding operations in parallel, store the respective decoded results in a predetermined storage area of the interleave RAM 23, and interleave or deinterleave by reading the data from the interleave RAM 23 in a predetermined sequence, and the turbo decoding is conducted by repeating such operations a plural number of times.

According to Specific Example 2; in the case of writing the backward-probability calculation results in the second storage area of the backward-probability RAM 223 by executing the processes in accordance with the Conventional Example 2, the backward-probability calculation results are written at the intervals of n-pieces of probabilities, and, the continuous backward-probability calculation results are not written as in the Conventional Example 2. In a case of calculating the joint-probability by employing the backward-probability calculation results, with respect to the portion written to the backward-probability RAM 223, the joint-probability is calculated by use of the value read from the backward-probability RAM 223. By contrast, with respect to the portion that is not written to the backward-probability RAM 223, the backward-probability is recalculated by employing the value written to the RAM 223 and the shift-probability calculation result used when calculating the forward-probability is calculated, and the joint-probability is calculated by use of the result thereof.

In FIG. 12, the backward-probability RAM 223 and the backward-probability calculation unit 224 are the components changed from the Conventional Example 2. A memory size (memory capacity) of the backward-probability RAM 223 is given by the time N/L+2ML through the time N/L+ML/(n+1), in which the area discretely stored with the data per L is the same, and the area stored continuously with the data in the L segment becomes ½(N+1). On the other hand, the increase quantity of the circuit scale is equivalent to an M-increase in the number of the backward-probability calculation units. However, if n takes a small value to some extent, the memory reduction quantity takes a large value as compared with the increase quantity in the number of the backward-probability calculation units, and hence a circuit scale-down effect of the whole turbo decoding device can be expected.

Figure 5:
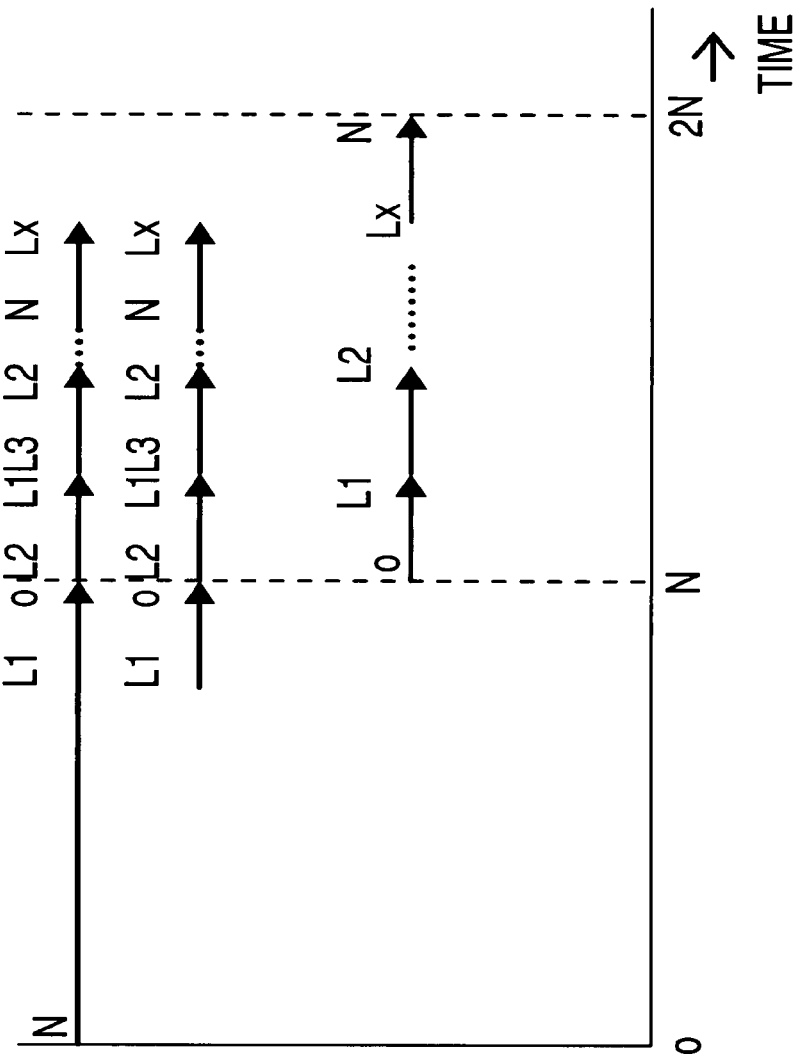
FIG. 5 is a timing chart showing a single MAP decoding process by a system of a Conventional Example 2.
Figure 6:
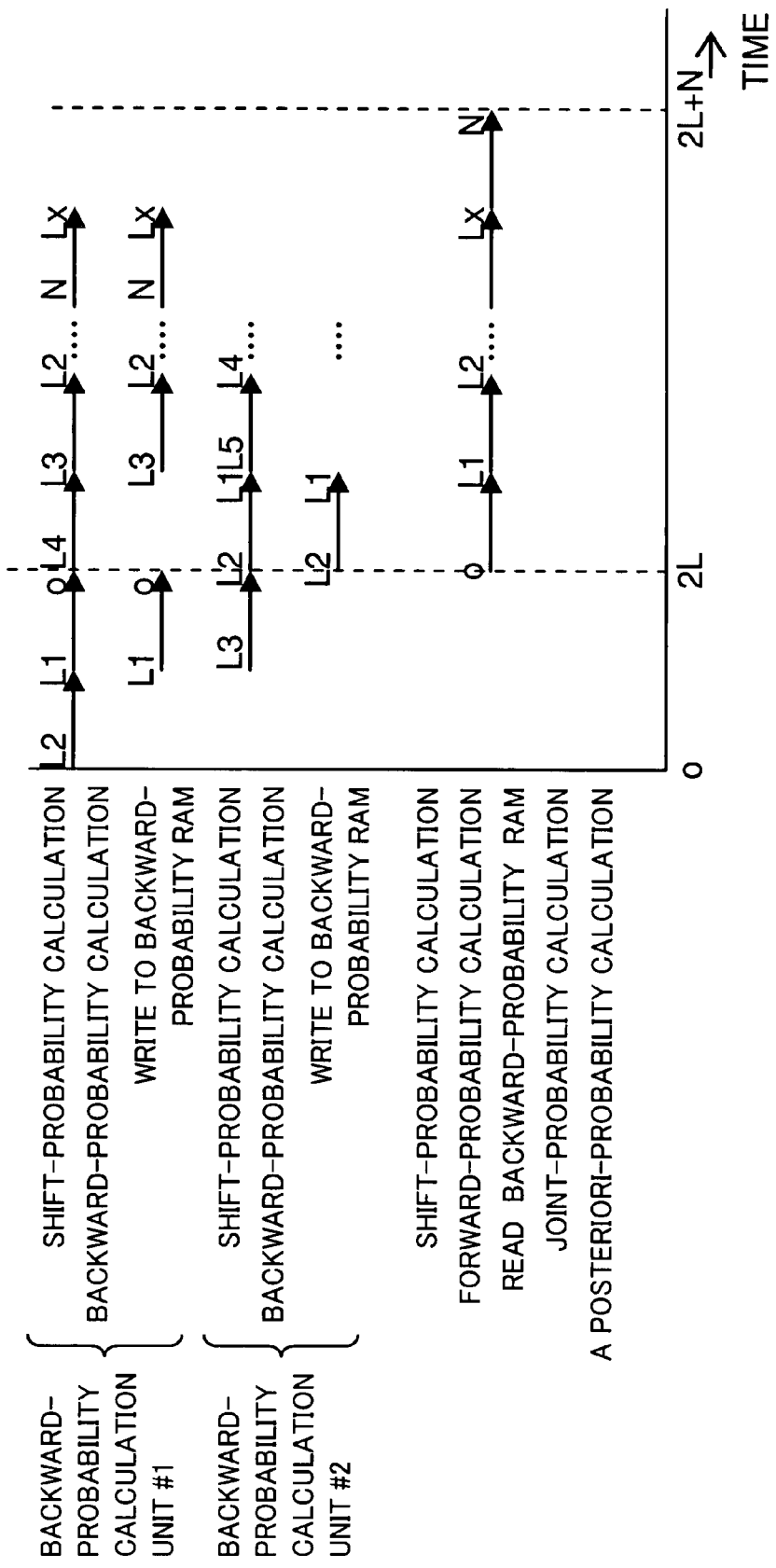
FIG. 6 is a timing chart showing a single MAP decoding process by the system of a Conventional Example 3.

Note that when the coded data u is not segmented, the turbo decoding process is executed by use of only one (e.g., MAP unit #1) of the plurality of MAP units 22. In this case, the decoding process is carried out according to the time chart as shown in FIG. 5. The continuous backward-probability calculation results (such as the backward-probability calculation results from L1 to 0) are, however, stored at the intervals of n-time, and the non-stored portions (probabilities) are recalculated when the forward-probability is calculated and used for calculating the joint-probability.

Specific Example 3

Next, a case of applying the system according to the present embodiment to the turbo decoding apparatus (Conventional Examples 3+4) attaining speed-up by applying the Conventional Example 4 to the Conventional Example 3, will be described by way of Specific Example 3. In this case, for simplifying the description, the Specific Example 3 includes a case of conducting the 1-fold speed-up in the Conventional Example 4, i.e., a case where the Conventional Example 4 is not applied.

FIG. 13 is a block diagram illustrating the turbo decoding apparatus in which the system according to the present embodiment is applied to the Conventional Examples 3 and 4 (3+4). A turbo decoding apparatus 20B illustrated in FIG. 13 has a configuration common to the turbo decoding apparatus 20 shown in FIG. 11, so the description will be focused mainly on a different configuration, while the description of the common configuration is omitted.

A turbo decoding apparatus 20B illustrated in FIG. 13 is different from the turbo decoding apparatus 20 (FIG. 11) in the following points. The turbo decoding apparatus 20B has a plurality of MAP units 22 (MAP units #1 to #M), and each MAP unit has the same configuration. The MAP unit includes three shift-probability calculation units 221A, 221B, and 221C and three backward-probability calculation units 222A, 222B, and 222C, the shift-probability calculation unit 221A links with the backward-probability calculation, unit 222A, the shift-probability calculation unit 221B links with the backward-probability calculation unit 222B, and the shift-probability calculation unit 221C links with the backward-probability calculation unit 224 and with the forward-probability calculation unit 225.

In Specific Example 3, if the signal length which is obtained by adding the tail bit to the information bits is an N-bit length, the communication path value RAM 21 segments the signal length into M-pieces and simultaneously inputs the segmented data to the respective MAP units #1, #2, . . . , #M. The MAP units #1, #2, . . . , #M simultaneously (in parallel) execute, based on the MAP decoding method in the Conventional Example 3, the MAP decoding process with respect to the segmented pieces of data (data blocks) 0–N/M, N/M–2N/M, . . . , (M–1)N/M–N that are segmented by N/M bits.

The first MAP unit #1 executes the following processes. A premise is that the segmented data (data block) 0–N/M is sub-segmented into a plurality of blocks (0-L1, L1-L2, L2-L3, . . . , Lx–N/M) on the L-by-L basis (by a predetermined length L), in which the L-based decoding process is conducted.

<1> The shift-probability calculation unit 221A and the backward-probability calculation unit 222A calculates the shift-probabilities and the backward-probabilities from the time L2(=L+Δ=2L, where Δ=L) toward the time 0, and store and retain the backward-probability calculation results from the time L−1 to the time 0 at the intervals of n-time (e.g., n=1) in the backward-probability RAM 223. It is to be noted that the backward-probabilities from the time L2(=L+B=2L) to the time L1(=L) have none of the reliability and are therefore discarded.

<2> Next, the shift probability calculation unit 221C and the forward-probability calculation unit 225 calculate the shift-probabilities and the forward-probabilities from the time 0 toward the time L−1(L1−1), and the joint-probability calculation unit 226 calculates the joint-probability by employing the forward-probabilities and the backward-probabilities read from the backward-probability RAM 223.

At this time, if the backward-probability calculation result used for calculating the joint-probability is not stored in the backward-probability RAM 223, the backward-probability calculation unit 224 recalculates the backward-probability by using the method explained in FIGS. 8 to 10, and the joint-probability calculation unit 226 calculates the joint-probability by employing the recalculated backward-probability and the forward-probability corresponding thereto. The a posteriori-probability calculation unit 227 and the external information likelihood calculation unit 228 execute the a posteriori-probability calculation and the external information likelihood calculation, respectively.

<3> During the calculation of the backward-probability by the backward-probability calculation unit 222A (for example, at a point of time when the calculation of the backward-probability from the time L2 to the time L1 is finished), the shift-probability calculation unit 221B and the backward-probability calculation unit 222B calculate the shift-probabilities and the backward-probabilities from the time L3(=2L+B=3L) to the time L1(=L), and store and retain the backward-probability calculation results from the time 2L−1 (L2−1) to the time L(L1) at the intervals of n-time (e.g., n=1) in the backward-probability RAM 223. Note that the backward-probabilities from the time L3(=2L+B=3L) to the time L2(=2L) have no reliability and therefore are discarded.

<4> After finishing the operation <3>, the shift-probability calculation unit 221C and the forward-probability calculation unit 225 calculate the shift-probabilities and the forward-probabilities from the time L(L1) to the time 2L−1(L2−1), and the joint-probability calculation unit 226 calculates the joint-probability by employing the calculated forward-probability and the backward-probability read from the backward-probability RAM 223 or the backward-probability recalculated by the backward-probability calculation unit 224. The a posteriori-probability calculation unit 227 and the external information likelihood calculation unit 228 calculate the posteriori-probability and the external information likelihood, respectively.

Hereinafter, the external information likelihoods from the time 0 to the time N/M−1 are similarly calculated by repeating the processes on the L-by-L basis.

Moreover, in the i-th MAP units #i (e.g., i=2), the next process targeted at the segmented data in the time N/M to the time 2N/M is executed. A premise is that the segmented data in the time N/M−2N/M is sub-segmented into a plurality of blocks (0-L1, L1-L2, L2-L3, . . . , Lx−2N/M) on the L-by-L basis, in which the L-based decoding process is carried out.
<1> The shift-probability calculation unit 221A and the backward-probability calculation unit 222A calculate the shift-probabilities and the backward-probabilities from the time (i−1)N/M+L+Δ toward the time (i−1)N/M (L2->0), and store and retain the backward-probabilities calculation results from the time (i−1)N/M+L−1 to the time (i−1)N/M at the intervals of n-time (e.g., n=1) in the backward-probability RAM 223. Note that the backward-probabilities from the time (i−1)N/M+L+Δ to the time (i−1)N/M+L(L2 to L1) have no reliability and therefore are discarded.

<2> Next, the shift-probability calculation unit 221C and the forward-probability calculation unit 225 calculate the shift-probabilities and the forward-probabilities from the time (i−1)N/M−Δ toward the time (i−1) N/M (N/M−Δ→N/M), and subsequently calculate the shift-probabilities and the forward-probabilities from the time (i−1)N/M toward the time (i−1)N/M+L−1 (N/M→L1).

Further, the joint-probability calculation unit 226 calculates the joint-probabilities by using the forward-probabilities from the time (i−1)N/M to the time (i−1)N/M+L−1 and the backward-probabilities read from the backward-probability RAM 223 or the backward-probabilities recalculated by the backward-probability calculation unit 224, and the a posteriori-probability calculation unit 227 and the external information likelihood calculation unit 228 calculate the a posteriori-probability and the external information likelihood, respectively.

<3> During the calculation by the backward-probability calculation unit 222A (for example, at a point of time when the calculation in L2 to L1 is finished), the shift-probability calculation unit 221B and the backward-probability calculation unit 222B calculate the shift-probabilities and the backward-probabilities from the time (i−1)N/M+2L +Δtoward the time (i−1)N/M+L(L3->L1), and store and retain the backward-probability calculation results from the time (i−1)N/M+ 2L−1 to the time (i−1)N/M+L(L2 to L1) at the intervals of n-time (e.g., n=1) in the backward-probability RAM 223. The backward-probabilities from L3 to L2 are discarded.

<4> Next, the shift-probability calculation unit 221C and the forward-probability calculation unit 225 calculate the shift-probabilities and the forward-probabilities from the time (i−1)N/M+L toward the time (i−1)N/M+2L−1 (L1→L2), then the joint-probability calculation unit 226 calculates the joint-probability by using the calculated forward-probability and the backward-probability stored in the backward-probability RAM 223 or the backward-probability recalculated by the backward-probability calculation unit 224, and the a posteriori-probability calculation unit 227 and the external information likelihood calculation unit 228 calculate the a posteriori-probability and the external information likelihood, respectively.

Hereinafter, the external information likelihoods from the time (i−1)N/M to the time iN/M−1 are similarly calculated by repeating the processes on the L-by-L basis.

Moreover, in the M-th MAP unit #M, the next process targeted at the segmented data in the time N/(M−1)/M to the time N is executed. A premise is that the segmented data in the time N/(M−1)M to the time N is sub-segmented into a plurality of blocks (0-L1, L1-L2, L2-L3, . . . , Lx−2N/M) by the predetermined length L, in which the L-based decoding process is carried out.

<1> The shift-probability calculation unit 221A and the backward-probability calculation unit 222A calculate the shift-probabilities and the backward-probabilities from (M−1)N/M+L+Δ toward (M−1)N/M (L2->0), and store and retain the backward-probabilities calculation results from (M−1)N/M+L−1 to (M−1)N/M at the intervals of n-pieces of probabilities (e.g., n=1) in the backward-probability RAM 223. Note that the backward-probabilities from (M−1)N/M+L+Δ to (M−1)N/M+L have no reliability and therefore are discarded.

<2> Next, the shift-probability calculation unit 221C and the forward-probability calculation unit 225 calculate the shift-probabilities and the forward-probabilities from (M−1)N/M−Δ toward (M−1)N/M, and subsequently calculate the shift-probabilities and the forward-probabilities from (M−1)N/M toward (M−1)N/M+L−1 ((M−1)N/M->L1). Further, the joint-probability calculation unit 226 calculates the joint-probabilities by use of the forward-probabilities from (M−1)N/M to (M−1)N/M+L−1 and the backward-probabilities stored in the backward-probability RAM 223 or the backward-probabilities recalculated by the backward-probability calculation unit 224. The a posteriori-probability calculation unit 227 and the external information likelihood calculation unit 228 calculate the a posteriori-probability and the external information likelihood, respectively.

<3> During the calculation by the backward-probability calculation unit 222A (for example, at a point of time when the calculation in L2 to L1 is finished), the shift-probability calculation unit 221B and the backward-probability calculation unit 222B calculate the shift-probabilities and the backward-probabilities from (M−1)N/M+2L+B toward (M−1)N/M+L(L3→L1), and store and retain the backward-probability calculation results from (M−1)N/M+2L−1 to (M−1)N/M+L at the intervals of n-pieces of probabilities (e.g., n=1) in the backward-probability RAM 223. The backward-probabilities from L3 to L2 are discarded.

<4> Next, the shift-probability calculation unit 221C and the forward-probability calculation unit 225 calculate the shift-probabilities and the forward-probabilities from (M−1)N/M+L toward (M−1)N/M+2L−1 (L1→L2). The joint-probability calculation unit 226 calculates the joint-probability by use of the calculated forward-probability and the backward-probability (one of the stored backward-probability and the recalculated backward-probability). The a posteriori-probability calculation unit 227 and the external information likelihood calculation unit 228 calculate the a posteriori-probability and the external information likelihood, respectively.

Hereinafter, the external information likelihoods from the time (M−1)N/M to the time N−1 are similarly calculated by repeating the processes on the L-by-L basis.

The respective MAP units #1, #2, . . . , #M perform the MAP decoding operations in parallel, store the decoded results in a predetermined storage area of the interleave RAM 23, and interleave or deinterleave by reading the data from the RAM 23 in a predetermined sequence, and the turbo decoding is conducted by repeating such operations multiple times.

In the configuration of Specific Example 3, the backward-probability calculation results are written at the intervals of n-time to the backward-probability RAM 223. In a case of calculating the joint-probability by employing the backward-probability calculation results, with respect to the portion written to the backward-probability RAM 223, the value read therefrom is employed, and with respect to the portion that is not written, the backward-probability is recalculated by employing the value written to the RAM 223 and the shift-probability calculation result used when the forward-probability is calculated, and the joint-probability is calculated by use of the result thereof.

In FIG. 13, the backward-probability RAM 223 and the backward-probability calculation unit 224 are the components changed from the Conventional Examples 3 and 4 (3+4). A memory size (memory capacity) of the backward-probability RAM 223 is given by 2ML through ML/(N+1), resulting in ½(n+1). On the other hand, the increase quantity of the circuit scale is equivalent to M pieces of the backward-probability calculation unit. If n takes a small value to some extent, however, the memory reduction quantity takes a large value as compared with the increase quantity in the number of the backward-probability calculation units, and hence a circuit scale-down effect of the whole turbo decoding device can be expected.

It should be noted that in the embodiment of the present invention, if n is equal to or larger than 2, for example, the backward-probabilities $\beta(i-1)$, $\beta(i+2)$ . . . from the next one can be recalculated by using the backward-probability $\beta(i)$ recalculated from the backward-probability $\beta(i+1)$ stored in the memory.

OTHERS

The disclosures of Japanese patent application No. JP2006-280655 filed on Oct. 13, 2006 including the specification, drawings and abstract are incorporated herein by reference.

What is claimed is:
1. A turbo decoding apparatus, comprising:
a backward-probability calculation unit that executes backward-probability calculation from time N (N is a natural number) to time 0 with respect to coded data having an information length N which is encoded with turbo-encoding;
a storage unit to store a fraction of backward-probability calculation contiguous results, the fraction being made of every n'th (n is a natural number) result from the backward-probability calculation contiguous results;
a forward-probability calculation unit that executes forward-probability calculation from time 0 to time N with respect to the coded data; and
a decoded result calculation unit that calculates a decoded result of the coded data through joint-probability calculation using forward-probability calculation results by the forward-probability calculation unit and the backward-probability calculation results stored in the storage unit and backward-probability calculation results obtained through recalculation by the backward-probability calculation unit, wherein the recalculation is executed partially in parallel with a cycle of reading the backward-probability calculation results from the storage unit.

2. A turbo decoding apparatus, comprising:
a backward-probability calculation unit that executes backward-probability calculation from time N (N is a natural number) to time 0 with respect to coded data having an information length N which is encoded with turbo-encoding;
a storage unit to store a fraction of backward-probability calculation contiguous results, the fraction being made of every n'th (n is a natural number) result from the backward-probability calculation contiguous results;
a forward-probability calculation unit that executes forward-probability calculation from time 0 to time N with respect to the coded data; and
a decoded result calculation unit that calculates a decoded result of the coded data through joint-probability calculation using forward-probability calculation results by the forward-probability calculation unit and the backward-probability calculation results stored in the storage unit and backward-probability calculation results obtained through recalculation by the backward-probability calculation unit, wherein:
the joint-probability calculation is executed in parallel with the forward-probability calculation;
the decoded result calculation unit calculates, if a backward-probability calculation result at time i (i is a natural number) being one of the times 0 to N corresponding to a forward-probability calculation result at the time i calculated by the forward-probability calculation unit is stored in the storage unit, a joint-probability at the time i by using the backward-probability calculation result at the time i stored in the storage unit and the forward-probability calculation result at the time i;
the backward-probability calculation unit recalculates, if the backward-probability calculation result at the time i is not stored in the storage unit, the backward-probability at the time i based on a shift-probability calculation result at time (i+1) for calculating a forward-probability at the time (i+1) and a backward-probability calculation result at the time (i+1) stored in the storage unit; and
the decoded result calculation unit calculates the joint-probability at the time i by using the recalculated backward-probability calculation result at the time i and the forward-probability calculation result at the time i.

3. A turbo decoding apparatus, comprising:
a backward-probability calculation unit that executes backward-probability calculation per time with respect to coded data having a information length N (N is a natural number) which is encoded with turbo-encoding;
a storage unit to store backward-probability calculation results by the backward-probability calculation unit;
a forward-probability calculation unit that executes forward-probability calculation per time with respect to the coded data; and
a decoded result calculation unit that calculates a decoded result of the coded data through joint-probability calculation using backward-probability calculation results and forward-probability calculation results, wherein:
the backward-probability calculation unit executes the backward-probability calculation of the coded data from time N toward time 0 and stores backward-probability calculation results extracted from the backward-probability calculation results at the times N through 1 at intervals of n-time (n is a natural number) in the storage unit;
the forward-probability calculation unit executes the forward-probability calculation of the coded data from the time 1 toward the time N; and
the decoded result calculation unit calculates, upon calculating a joint-probability at time i (i is a natural number) being one of times 0 to N based on a forward-probability calculation result at the time i and a backward-probability calculation result at the time i, if the backward-probability calculation result at the time is not stored in the storage unit, the joint-probability of the time i by using the backward-probability calculation result of the time i and the forward-probability calculation result at the time i, otherwise, calculates the joint-probability of the time i by using the backward-probability calculation result at the time i that is recalculated by the backward-probability calculation unit and the forward-probability calculation result at the time i, and outputs a decoded result of the coded data through the joint-probability calculation.

4. A turbo decoding apparatus for decoding coded data having an information length N-bit (N is a natural number) which is encoded with turbo-encoding, dividing the coded data into a plurality of sections each having a predetermined length L-bit (L is a natural number), performing a decoding process for every section, and comprising:
a backward-probability calculation unit that executes a backward-probability calculation with respect to the coded data;
a storage unit to store backward-probability calculation results;
a forward-probability calculation unit that executes forward-probability calculation with respect to the coded data; and
a decoded result calculation unit that calculates a decoded result of the coded data through joint-probability calculation based on backward-probability calculation results and forward-probability calculation results, wherein:
the backward-probability calculation unit executes the backward-probability calculation of the coded data from an N-th bit toward a first bit of the coded data, stores discrete backward-probability calculation results with respect to each section from the N-th bit to an (L+1)th bit in the storage unit, for every predetermined length L, and stores backward-probability calculation results extracted from continuous backward-probability calculation results of the first bit through an L-th bit at intervals of n-bit (n is a natural number) in the storage unit;
the forward-probability calculation unit executes the forward-probability calculation of the first bit through the L-th bit;
upon calculating a joint-probability of an i-th (i is a natural number) bit, which exist in a section from the first bit to the L-th bit, if a backward-probability calculation result of the i-th bit is stored in the storage unit, the decoded result calculation unit calculates the joint-probability of the i-th bit by using the backward-probability calculation result of the i-th bit stored and a forward-probability calculation result of the i-th bit calculated by the forward-probability calculation unit, otherwise, the decode result calculation unit calculates the joint-probability of the i-th bit by using the backward-probability calculation result of the i-th bit that is recalculated by the backward-probability calculation unit and the forward-probability calculation result of the i-th bit, and the decode result calculation unit outputs decoded results in the section from the first bit to the L-th bit;
the backward-probability calculation unit executes the backward-probability calculation with respect to a section from an (L+1)th bit to a 2L-th bit by using the discrete backward-probability calculation results stored in the storage unit, and stores a fraction of backward-probability calculation results, the fraction being made of every n'th result from the backward-probability calculation results of the backward-probability calculation with respect to the section from the (L+1)th bit to the 2L-th bit, in the storage unit;

the forward-probability calculation unit executes the forward-probability calculation with respect to the section from the (L+1)th bit to the 2L-th bit; and upon calculating a joint-probability of an i-th bit, which exist in the section from the (L+1)th bit to the 2L-th bit, if a backward-probability calculation result of the i-th bit is stored in the storage unit, the decoded result calculation unit calculates the joint-probability of the i-th bit by using the backward-probability calculation result of the i-th bit stored and a forward-probability calculation result of the i-th bit calculated by the forward-probability calculation unit, otherwise, the decode result calculation unit calculates the joint-probability of the i-th bit by using the backward-probability calculation result of the i-th bit that is recalculated by the backward-probability calculation unit and the forward-probability calculation result of the i-th bit, and the decode result calculation unit outputs decoded results in the section from the (L+1)th bit to the 2L-th bit.

5. A turbo decoding apparatus for decoding corded data of N-bit (N is a natural number) which is encoded with turbo-encoding, segmenting the coded data into a plurality of sections each having a predetermined length L (L is a natural number), performing a decoding process for every section, and comprising:

a first backward-probability calculation unit and a second backward-probability calculation unit each executing backward-probability calculation with respect to the coded data;

a storage unit to store backward-probability calculation results;

a forward-probability calculation unit executing forward-probability calculation with respect to the coded data; and a decoded result calculation unit that calculates a decoded result of the coded data through joint-probability calculation using backward-probability calculation results and forward-probability calculation results, wherein:

the first backward-probability calculation unit executes the backward-probability calculation from a 2L-th bit toward a first bit of the coded data, and stores a fraction of backward-probability calculation results, the fraction being made of every n'th result from the results of the backward-probability calculation from a L-th bit to the first bit, in the storage unit;

the forward-probability calculation unit executes the forward-probability calculation from the first bit to the L-th bit;

upon calculating a joint-probability of an i-th bit (i is a natural number), which exists in a section from the first bit to the L-th bit, based on a forward-probability calculation result of the i-th bit and a backward-probability calculation result of the i-th bit, if the backward-probability calculation result of the i-th bit is stored in the storage unit, the decoded result calculation unit calculates the joint-probability of the i-th bit by using the backward-probability calculation result of the i-th bit and the forward-probability calculation result of the i-th bit, otherwise, the joint-probability calculation unit calculates the joint-probability of the i-th bit by using the backward-probability calculation result of the i-th bit that is recalculated by the first backward-probability calculation unit and the forward-probability calculation result of the i-th bit, to calculate a decoded result with respect to the section from the first bit to the L-th bit;

the second backward-probability calculation unit starts the backward-probability calculation from a 3L-th bit toward an (L+1)th bit of the coded data during the backward-probability calculation from the 2L-th bit to the first bit by the first backward-probability calculation unit, and stores backward-probability calculation results that backward-probability calculation results from the 2L-th bit to the (L+1)th bit are thinned out in the storage unit; the forward-probability calculation unit executes the forward-probability calculation from the (L+1)th bit to the 2L-th bit; and upon calculating a joint-probability of an i-th bit, which exists in a section from the (L+1)th bit to the 2L-th bit, based on a forward-probability calculation result of the i-th bit and a backward-probability calculation result of the i-th bit, if the backward-probability calculation result of the i-th bit is stored in the storage unit, the decoded result calculation unit calculates the joint-probability of the i-th bit by using the backward-probability calculation result of the i-th bit and the forward-probability calculation result of the i-th bit, otherwise, the joint-probability calculation unit calculates the joint-probability of the i-th bit by using the backward-probability calculation result of the i-th bit that is recalculated by the second backward-probability calculation unit and the forward-probability calculation result of the i-th bit, to calculate a decoded result with respect to the section from the (L+1)th bit to the 2L-th bit.

6. A turbo decoding apparatus for decoding turbo-encoded data through repetition of element decoding, comprising:

M-number (M is a natural number) of element decoders each performing element decoding to one of M-pieces of divided data obtained by dividing turbo-encoded data having an information length N-bit (N is a natural number) by M; and an interleaver/deinterleaver for alternately interleaving and deinterleaving M-pieces of results of element-decoding collectively, wherein each of the M-number of element decoders includes:

a backward-probability calculation unit that executes backward-probability calculation with respect to one of the M-pieces of divided data;

a storage unit to store backward-probability calculation results extracted from N/M-pieces of backward-probability calculation results with respect to the one of the M-pieces of divided data at intervals of n-piece (n is a natural number);

a forward-probability calculation unit that executes a forward-probability calculation with respect to the one of the M-pieces of divided data; and a decoded result calculation unit that outputs element-decoded results of the M-pieces of divided data through joint-probability calculation by using N/M-pieces of forward-probability calculation results with respect to the one of the M-pieces of divided data and N/M-pieces of backward-probability calculation results obtained by reading from the storage unit or obtained through recalculation by the backward-probability calculation unit.

7. A turbo decoding apparatus for decoding turbo-encoded data through repetition of element decoding, comprising:

M-number (M is a natural number) of element decoders each performing element decoding to one of M-pieces of divided data obtained by dividing turbo-encoded data having an information length N-bit (N is a natural number) by M; and an interleaver/deinterleaver for alternately interleaving and deinterleaving M-pieces of results of element-decoding collectively, wherein each of the M-number of element decoders includes:

a backward-probability calculation unit that executes backward-probability calculation with respect to one of the M-pieces of divided data;

a storage unit to divide one of the M-pieces of divided data into X-pieces (X is a natural number) of sections by a predetermined length L (L is a natural number), to store backward-probability calculation results in each of X-th through second sections within the X-pieces of sections for every predetermined length L discretely with intervals of the predetermined length L, and to store backward-probability calculation results extracted from L-pieces of backward-probability calculation results with respect to a first section within the X-pieces of sections at intervals of n-piece (n is a natural number);

a forward-probability calculation unit that executes forward-probability calculation with respect to one of the M-pieces divided data; and a decoded result calculation unit that calculates, with respect to the respective sections of the M-pieces of divided data, element-decoded results in the respective sections through joint-probability calculation by using L-pieces of forward-probability calculation results and L-pieces of backward-probability calculation results corresponding thereto, wherein:

the decoded result calculation unit outputs the element-decoded result with respect to the first section through the joint-probability calculation by using L-pieces of forward-probability calculation results in the first section calculated by the forward-probability calculation unit and L-pieces of backward-probability calculation results in the first section obtained by reading from the storage unit or obtained through recalculation by the backward-probability calculation unit;

the backward-probability calculation unit executes the backward-probability calculation with respect to a next section by using the backward-probability calculation results regarding the next section stored in the storage unit, calculates L-pieces of backward-probability calculation results regarding the next section, and stores backward-probability calculation results extracted from the L-pieces of backward-probability calculation results regarding the next section at intervals of n-piece in the storage unit;

the forward-probability calculation unit executes forward-probability calculation with respect to the next section to obtain L-pieces of forward-probability calculation results regarding the next section; and the decoded result calculation unit outputs the element-decoded result with respect to the next section through joint-probability calculation by using the L-pieces of forward-probability calculation results regarding the next section and L-pieces of backward-probability calculation results regarding the next section obtained by reading from the storage unit or obtained through recalculation by the backward-probability calculation unit.

8. A turbo decoding apparatus for decoding turbo-encoded data through repetition of element decoding, comprising:

M-number (M is a natural number) of element decoders each performing element decoding to one of M-pieces of divided data obtained by dividing turbo-encoded data having an information length N-bit (N is a natural number) by M; and an interleaver/deinterleaver for alternately interleaving and deinterleaving M-pieces of results of element-decoding collectively, wherein each of the M-number of element decoders includes:

a backward-probability calculation unit that executes backward-probability calculation with respect to one of the M-pieces of divided data;

a storage unit to store backward-probability calculation results regarding one of the M-pieces of divided data;

a forward-probability calculation unit that executes forward-probability calculation with respect to one of the M-pieces of divided data; and a decoded result calculation unit that calculates the element-decoded results through calculation of a joint-probability using an forward-probability calculation result and the backward-probability calculation results, wherein:

the backward-probability calculation unit divides one of the M-pieces of divided data into a plurality of sections for every predetermined length L (L is a natural number), executes backward-probability calculation regarding a 2L-th bit through a first bit, and stores backward-probability calculation results extracted from backward-probability calculation results of the 2L-th bit through the first bit at intervals of n-piece (n is a natural number), in the storage unit;

the forward-probability calculation unit executes forward-probability calculation regarding the first bit through a L-th bit of the one of the M-pieces of divided data;

the decoded result calculation unit executes joint-probability calculation by using forward-probability calculation results regarding the first bit through the L-th bit and backward-probability calculation results regarding the first bit through the L-th bit obtained by reading from the storage unit or obtained through recalculation by the backward-probability calculation unit, and outputs element-decoded results regarding a section from the first bit to the L-th bit;

the backward-probability calculation unit executes backward-probability calculation from a 3L-th bit to a (L+1)th bit of the one of the M-pieces of divided data during backward-probability calculation from a 2L-th bit to the first bit, and stores backward-probability calculation results extracted from backward-probability calculation results from the 2L-th bit to the (L+1)th bit at intervals of n-piece, in the storage unit;

the forward-probability calculation unit executes forward-probability calculation from the (L+1)th bit to the 2L-th bit; and the decoded result calculation unit executes joint-probability calculation by using forward-probability calculation results from the (L+1)th bit to the 2L-th bit and backward-probability calculation results from the (L+1)th bit to the 2L-th bit obtained by reading from the storage unit or obtained through recalculation by the backward-probability calculation unit, and outputs the element-decoded results regarding a section from the (L+1)th bit to the 2L-th bit.

* * * * *